United States Patent [19]
Aonuma et al.

[11] Patent Number: 5,909,107
[45] Date of Patent: Jun. 1, 1999

[54] STEP UP SWITCHING POWER UNIT AND FILTER CIRCUIT

[75] Inventors: Kenichi Aonuma; Yasuhiro Murai, both of Tokyo, Japan

[73] Assignee: TDK Corporation, Tokyo, Japan

[21] Appl. No.: 09/169,923

[22] Filed: Oct. 10, 1998

Related U.S. Application Data

[63] Continuation of application No. PCT/JP98/00308, Jan. 27, 1998.

[30] Foreign Application Priority Data

Feb. 10, 1997 [JP] Japan .................................. 9-026368
Jun. 24, 1997 [JP] Japan .................................. 9-166812
Jun. 25, 1997 [JP] Japan .................................. 9-168650

[51] Int. Cl.$^6$ .............................. G05F 1/10; H02J 1/02
[52] U.S. Cl. .......................................... 323/222; 363/39
[58] Field of Search ................................ 323/222, 282, 323/286; 363/21, 39

[56] References Cited

U.S. PATENT DOCUMENTS

| 4,027,225 | 5/1977 | Elvin ......................................... 363/39 |
| 5,315,497 | 5/1994 | Severinsky ................................ 363/39 |
| 5,321,348 | 6/1994 | Vinciarelli et al. . |
| 5,418,704 | 5/1995 | Hua et al. . |
| 5,654,626 | 8/1997 | Karlsson ................................. 323/222 |
| 5,847,548 | 12/1998 | He et al. ................................. 323/222 |

FOREIGN PATENT DOCUMENTS

| 1-311862 | 12/1989 | Japan . |
| 3-117362 | 5/1991 | Japan . |
| 4-372572 | 12/1992 | Japan . |
| 8-308219 | 11/1996 | Japan . |

Primary Examiner—Stuart N. Hecker
Attorney, Agent, or Firm—Frishauf, Holtz, Goodman, Langer & Chick, P.C.

[57] ABSTRACT

A switching power source device in which recovery current can be decreased. The power source device includes a magnetic element connected one of terminals of a power source section, a switch having one end connected with the magnetic element and the other end connected with the other terminal of the power source section, a smoothing capacitor connected between the magnetic element and the other terminal of the power source section, and a diode connected between the magnetic element and the smoothing capacitor with forward direction directed to pass current from the power source section through the magnetic element to the smoothing capacitor. A second magnetic element is provided in a path of recovery current which flows during a closing operation of the switch from the diode to the switch, whereby the second capacitor is charged by current from the first magnetic element during an open state of the switch and a resonance circuit is formed between the first magnetic element and the diode through the second magnetic element, the switch and the second capacitor to pass discharge current from the second capacitor.

30 Claims, 14 Drawing Sheets

STEP UP SWITCHING POWER UNIT AND FILTER CIRCUIT

This application is a continuation of PCT/JP98/00308, filed Jan. 27, 1998.

BACKGROUND ART

The present invention relates to a step-up switching power unit utilizing a switching technology to provide an output voltage higher than an input voltage.

PRIOR ART

A step-up switching power unit of this type includes, for example, a circuit shown by FIG. 1 of the Japanese patent published specification No. 2,512,670. The circuit includes a magnetic element such as a magnetic coil connected with one of the terminals of a power source. Switching means is connected between the magnetic element and the other of the terminals of the power source, whereas a smoothing capacitor is connected between the magnetic element and the aforementioned other terminal. A diode is connected between the magnetic element and the smoothing capacitor with the forward direction of the diode directed so that capacitor charging current can be passed from the power source through the magnetic element to the smoothing capacitor. The output of the power unit is provided between the opposing electrodes of the capacitor.

In this power unit, the frequency of operation of the switching means or the driving frequency is normally maintained constant and a stable output is provided through a control of the ratio of time wherein the switching means is closed in an operating cycle. The operation of the power unit is described in detail in the aforementioned patent specification.

It has been pointed out that one of significant problems in this type of unit is generation of a recovery current. During the period wherein the switching means is opened, there is a current through the diode which is equal to the input current and as soon as the switching means is closed the current through the diode is abruptly decreased. Thus, due to the property of the diode, current in the reverse direction is produced for a limited time resulting in the reverse current. The magnitude of the reverse current is proportional to the magnitude of the current which has been flowing through the diode immediately before the switching means is closed and the rate of decrease in the current through the diode after the switch means is closed. In the circuit shown in FIG. 1 of the aforementioned patent specification, the only factors which will restrict the rate of decrease in the current through the diode are the parasitic impedance which exists in the circuit and the resistance component which is produced when the switching means is operated from the open state to the closed state, so that the recovery current can amount to a significant value. The recovery current causes a switching loss and results in a decrease in efficiency. It should further be noted that the switching loss is produced every time the switching means is operated so that the switching loss increases in proportion to an increase in the driving frequency. Thus, the switching loss disturbs an effort to make the unit compact through an increase in the driving frequency. Further, the recovery current generally is of a very sharp pulse form so that significant noise is produced when a significant recovery current is produced. This makes it difficult to solve the noise problem.

Measures for solving the aforementioned problems in a step-up switching power unit are proposed by the Japanese Laid-Open Patent Publication No. Hei 4-372572 and the U.S. Pat. No. 5,418,704. The proposed system is to provide the switching circuit with a resonance circuit including a resonance inductor and a resonance capacitor, and control the resonance in the resonance by a second switching means which is provided separately from the first mentioned switching means. The proposed system is effective to reduce the switching loss, however, it requires a complicated control circuit for controlling the second switching means. Thus, the entire circuit is made complicated.

Alternative circuits for solving the aforementioned problem in different ways are disclosed in the published specification of the aforementioned Japanese Patent No. 2,512,670 and the Japanese Laid-Open Patent Publication No. Hei 3-117362. The circuits disclosed therein include a resonance inductor and a resonance capacitor which are arranged to cooperate with the switching means to provide a resonance circuit. The circuits are advantageous in that they are capable of suppressing the recovery current through the use of only one switching means. It should however be noted that the former is to propose to adopt a very complicated control of the driving frequency, whereas the latter is to propose to monitor the output voltage for controlling the driving frequency. Thus, both of the proposals require a variable control of the driving frequency. However, to change the driving frequency in response to input and output conditions is disadvantageous in that it makes filter design and noise suppression difficult. It should further be noted that, in a case where the step-up switching power unit is adopted in a power factor improving circuit, the input power source includes a full wave rectifying circuit for rectifying AC input. This provides a significantly wide range of input voltage values and therefore wide range of input frequency variation, which make the design and noise suppression more difficult.

Another problem inherent to the switching power unit of this type is generation of electromagnetic noise. The output of the switching circuit which is in the form of a pulse-shaped current is of a form showing an extremely sharp rising and falling characteristics. The current is passed along a loop which routs from the switching circuit through the smoothing capacitor and returned to the switching circuit, so that electromagnetic noise is produced in the loop. The fact that the current wave form shows an extremely sharp rising and falling characteristics means that the output pulse current increases from zero to a steady value in a very small period of time when the output pulse current starts to flow, and that the output current decreases from the steady value to zero in a very small period of time when the current stops to flow.

In order to reduce the electromagnetic noise, it is effective to make the aforementioned output current loop short. It should however be noted that the smoothing capacitor is usually constituted by an electrolytic capacitor having a substantial capacity and it is usually difficult for actual mounting and impractical to locate such a bulky capacitor in the vicinity of the switching element and the diode which are of heat generating nature. It should further be noted that tendency in recent years is to find wide-spread use in applications of switching power units which have respective functional blocks composed as discrete units. In these applications, the switching circuit provides one unit whereas the DC/DC converter or DC/AC converter provides another unit, the units being connected together with the smoothing capacitor interposed therebetween to provide a switching power unit. This type of switching power unit is advantageous in that the respective ones of the discrete units can be located in desired positions, however, such location makes the aforementioned loop undesirably larger.

The Japanese Laid-Open Patent Publication No. Hei 1-311862 discloses a switching power unit wherein an inductor such as a choke coil is interposed between the switching circuit of the aforementioned type and the smoothing capacitor. In the switching power unit disclosed in this patent publication, a choke coil is connected between the diode in the switching circuit and the smoothing capacitor, and a second diode and a resistor which are connected in series are connected in turn in parallel with the choke coil. A second capacitor is further connected in parallel with the resistor. The patent publication proposes a device in which circuit having the aforementioned choke coil is inserted between the switching circuit and the smoothing capacitor.

The switching power unit disclosed in the patent publication is effective to make slower the falling characteristics of the output current of the switching circuit, however, it is impossible to make slower the rising characteristics. It is therefore unable to expect a result of reducing or eliminating the electromagnetic noise.

DISCLOSURE OF THE INVENTION

The present invention has an object to solve the aforementioned problems in the conventional step-up type switching power unit and provide a step-up type switching power unit which can accomplish a soft switching by means of a simple arrangement and in which recovery current can be decreased.

Another object of the present invention is to make slower both the rising and falling characteristics of output current of the switching circuit in the switching power unit to thereby suppress noise which may be produced in the switching power unit.

In order to accomplish the above objects, the present invention provides an improvement in a switching power unit of the type including a first magnetic element connected to one of terminals of a power source section, switching means having one end connected with the magnetic element and the other end with the other terminal of the power source section, a smoothing capacitor connected between the first magnetic element and the other terminal of the power source section, a first diode connected between the first magnetic element and the smoothing capacitor with forward direction of the diode directed so that capacitor charging current is passed from the power source section through the first magnetic element to the smoothing capacitor, wherein output is provided at opposite electrodes of the smoothing capacitor.

According to one aspect of the present invention, the aforementioned type of switching power unit includes a second magnetic element disposed between the switching means and the first mentioned magnetic element, and a second capacitor arranged in parallel with the switching means and connected with the first mentioned magnetic element, whereby the second capacitor is charged when the switching means is in an open state by current from the first magnetic element, the current from the first magnetic element to the switching means is passed through the second magnetic means in an initial part of time period when the switching means is in a closed state so that rising of current through the switching means is suppressed to thereby suppress recovery current, and a first resonance circuit for allowing flow of discharging current from the second capacitor is established between the first magnetic element and the first diode through the second magnetic element, the switching means and the second capacitor.

According to another aspect of the present invention, there is provided a second magnetic element in a passage where recovery current flows from the first diode through the switching means during time period when the switching element is in the closed state, a second capacitor being provided in parallel with the switching means and connected with the first magnetic element, whereby the second capacitor is charged in the open state of the switching means by current from the first magnetic element, and a first resonance circuit is established in the closed state of the switching means between he first magnetic element and the first diode through the second magnetic element, the switching means and the second capacitor.

In the step up type switching power unit of the aforementioned aspect, the voltage at the switching means is reduced to zero when the switching means is operated from the open state to the closed state. Therefore, the second magnetic element is subjected to a voltage which is substantially equal to the output voltage, so that the current through the second magnetic element and the switching means is linearly increased. The magnitude of the recovery current which is produced at this period is dependent on the rate of decrease in the diode current. According to the present invention, however, the second magnetic element is inserted into the circuit through which the recovery current flows, so that the impedance of the second magnetic element functions to restrict the rate of the current decrease with the result that the recovery current is also restricted. In this instance, the rate of increase in the current through the switching means is slow in relation to the rate of decrease in the voltage in the switching means. It is therefore possible to substantially eliminate switching loss. It should further be noted that when the switching means is opened the voltage applied to the switching means is increased while the second capacitor is being charged. It is therefore possible to decrease the rate of increase in the voltage applied to the switching means to thereby decrease the loss in the switching means.

According to a further aspect of the present invention, there is provided a third capacitor arranged between the first magnetic element and the second capacitor in series with the second capacitor so that the third capacitor is charged by the resonance current produced in the first resonance circuit. A bypass circuit is further provided to connect the second magnetic element between the second capacitor and the third capacitor and has a second diode disposed in the bypass circuit with forward direction of the diode directed from the second magnetic element to the second and third capacitors, whereby a second resonance circuit is produced between the first magnetic element and the first diode through the second magnetic element, the second diode and the third capacitor for making the second diode conductive when the charge voltage of the second capacitor is decreased through a discharge of the second capacitor. In this instance, it is preferable that the third capacitor is of a capacity which is larger than that of the second capacitor. It is possible with this arrangement to suppress the voltage applied to the first diode when the switching means is closed.

It should further be noted that in accordance with the present invention it is preferable to provide a third diode between the second and third capacitors with forward direction oriented in the direction for allowing current from the second diode to flow. In this instance, it is further preferable to provide a fourth diode to allow the current from the third diode to flow to the smoothing capacitor bypassing the third capacitor and the first diode. It is also preferable in this instance to divide the first magnetic element into two parts and connect one of the divided magnetic element portions to the power source section, the other of the divided magnetic element portions being connected in the second resonance circuit with a polarity that the second, third and fourth diodes are subjected to a reverse bias in the open state of the switching means. The fourth diode provides a circuit for directing a reset current to the output side in the open state of the switching means. With the aforementioned arrangement wherein the first magnetic element is divided into two portions and the divided portion of the magnetic element is connected in the second resonance circuit, it is possible to decrease the reset time of the second magnetic element. It should further be noted that with the connection of the other of the divided portions of the magnetic element in the second resonance circuit in the manner that the second, third and fourth diodes are subjected to reverse bias during the open state of the switching means, the current which flows through the magnetic element portion which is connected with the power source section is totally passed to the first diode when the switching means is opened and after the second magnetic element is reset.

According to a preferable mode of the present invention, the first magnetic element is divided into two parts, one of the divided parts being connected with the power source section and the other divided part within the second resonance circuit.

According to a further aspect of the present invention, the aforementioned type of switching power unit is constructed so that the magnetic element includes a first and second windings, the first winding being connected at one end with the switching means and at the other end with the power source section, and the second winding being connected at one end with the first diode and at the other end with the power source section, so that current flows from the power source section through the second wind of the magnetic element when the switching means is opened whereas the current flows from the power source section through the first winding of the magnetic element when the switching means is closed. The first and second windings are connected in series in the flow path of the recovery current which flows from the first diode to the switching means in an initial period of closing operation of the switching means, so that rising of the current through the switching means in the initial period of the closing operation of the switching means can be suppressed. A second capacitor may be provided so that it is connected with the switching means in parallel with the first magnetic means, so that the second capacitor is charged by the current from the first magnetic means when the switching means is opened whereby a first resonance circuit is formed through the first winding of the magnetic element, the switching means and the second capacitor for allowing the second capacitor to discharge when the current through the first winding is increased beyond a predetermined value.

According to the step-up type switching power unit of the aforementioned aspect of the present invention, the voltage at the switching means is decreased to zero when the switching means is turned from the open state to the closed state, so that the leak inductor contained in the magnetic element is applied with a voltage which is substantially the same as the output voltage with the result that the current through the switching means is linearly increased. The amount of the recovery current produced at this instance is dependent on the rate of decrease in the diode current. According to the present invention, the magnetic element is in the circuit where the recovery current flows. Therefore, the rate of the current decrease can be suppressed due to the existence of leak inductor contained in the magnetic element and the recovery current is accordingly restricted. In this instance, the increase in the current through the switching means is slower than the rate of decrease in the voltage at the switching means. Therefore, there will be substantially no switching loss. It should further be noted that the voltage at the switching means is increased while the second capacitor is being charged. It is therefore possible to decrease the rate of increase in the voltage at the switching means to thereby decrease the switching loss.

According to a still another aspect of the present invention, there is provided a third capacitor which is connected between the first and second windings of the magnetic element in parallel with the second capacitor so that the third capacitor is charged by a resonance current which flows through the first resonance circuit. A bypass circuit is provided by connecting the first winding of the magnetic element between the second and third capacitors. The bypass circuit may be provided with a second diode in a manner that the forward direction of the diode is directed from the first winding of the magnetic element toward the second and third capacitors, so that the second diode is made conductive when the second capacitor is discharged and the charge voltage of the second capacitor is decreased to a predetermined value, whereby a second resonance circuit is formed between the magnetic element and the first diode through the magnetic element, second diode and the third capacitor. In this instance, it is preferable that the third capacitor is of a capacity which is larger than that of the second capacitor. The arrangement is effective to suppress the voltage applied to the first diode when the switching means is closed.

It is also preferable in this aspect of the present invention to provide a third diode between the second and third capacitors with the forward direction of the third diode directed to allow the current from the second diode to pass. It is further preferable in this instance to provide a fourth diode which passes current from the third diode to the smoothing capacitor bypassing the third capacitor and the first diode. The fourth diode then provides a circuit through which the reset current is passed to the output side when the switching means is opened. By having the number of turns of the first winding smaller than that of the second winding, it is possible to shorten the reset time of the leak inductor in the magnetic element. With the first winding having the number of turns smaller than that of the second winding, reverse bias is applied to the second, third and fourth diodes when the switching means is in the open state. Thus, when the switching means is opened and after the magnetic element is reset, the current through the magnetic element which is connected with the power source section is totally passed to the first diode.

According to a further aspect of the present invention, there is provided a switching power unit including a novel filter circuit. The switching power unit in accordance with the present invention comprises a switching circuit including a first magnetic element connected at one end with one of output terminals of a power source section, a switching element connected between the other of the output terminals of the power source section and the other end of the first magnetic element and a diode connected with the first magnetic element and the switching element, and a first capacitor connected with an output of the switching circuit for smoothing the output of the switching circuit. A filter circuit is connected between the output of the switching circuit and the smoothing first capacitor. The filter circuit comprises a filter circuit capacitor connected with the output of the switching circuit, a filter circuit magnetic element having one end connected with one end of the filter circuit capacitor, and a filter circuit resistance element connected in parallel with the filter circuit magnetic element, the other end of the filter circuit capacitor and the other end of the filter circuit magnetic element being connected respectively with the opposite ends of the smoothing first capacitor.

In this aspect of the present invention, a second diode may be connected in series with the filter circuit resistance element and in parallel with the filter circuit magnetic element. The second diode may be connected with the forward direction directed toward the aforementioned other end of the filter circuit capacitor or toward the aforementioned one end of th filter circuit capacitor.

The present invention further provides in another aspect a noise reducing filter circuit.

According to the structures described above, during the period in which the output current from the switching circuit rises, the output current rises in a short period so that the current is blocked from flowing into the smoothing first capacitor but is allowed to flow into the filter circuit capacitor provided in the filter circuit. Thus, the output current from the switching circuit charges the filter circuit capacitor. The current is then gradually passed from the filter circuit magnetic element to the smoothing first under an LC resonance produced between the filter circuit magnetic element and the filter circuit capacitor. Thus, the current into the smoothing first capacitor rises slowly. Although there is a rapid increase in the current flowing into the filter circuit capacitor, the filter circuit capacitor may be of a capacity which is small in relation to the first capacitor, so that the filter circuit capacitor can be made small in size. It is therefore easy to locate the filter circuit capacitor in the vicinity of the switching circuit. As the result, it is possible to make short the pulse current loop which may be formed between the filter circuit capacitor and the switching circuit to thereby suppress generation of noise to a minimum level. The filter circuit resistance element connected in parallel with the filter circuit magnetic element functions to apply a braking effort to the resonance in the pulse current loop to cease the resonance current.

When the output current of the switching circuit falls rapidly, the filter circuit magnetic element tends to maintain the current to flow. Therefore, current supply is maintained from the filter circuit capacitor. The result is that an L-C resonance is produced between the filter circuit capacitor and the filter circuit magnetic element. Due to the resonance, the output current from the filter circuit is gradually decreased. It is therefore possible to make the current fall slow. In this instance, current flow through the second capacitor may fall rapidly, however, because of the reason as described above, it is possible to suppress generation of noise to a minimum level.

The filter circuit can be applied to the aforementioned step-up type switching power unit with a remarkable effect of noise suppression. In the switching power unit of this type, the switching circuit includes a second magnetic element disposed between the switching element and the first magnetic element, and a second capacitor connected with the first magnetic element in parallel with the switching element, so that the second capacitor is charged during the open period of the switching element by the current from the first magnetic element to thereby suppress increase in the current through the switching element in the initial period of closing operation of the switching element. A resonance circuit is then produced between the first magnetic element and the diode through the second magnetic element, the switching element and the second capacitor when the current through the second magnetic element is increased to a predetermined level to allow the discharge current from the second capacitor to pass.

In a further aspect, the switching power unit includes a switching circuit provided with a second capacitor disposed in a path of the recovery current which flows when the switching element is closed from the diode to the switching element, and a second capacitor connected with the first magnetic element in parallel with the switching element, so that the second capacitor is charged by the current from the first magnetic element during the open state of the switching element. A resonance circuit is then produced between the first magnetic element and the diode through the second magnetic element, the switching element and the second capacitor during the closed state of the switching element to allow the discharge current from the second capacitor to pass.

DESCRIPTION OF THE PREFERRED EMBODIMENTS

Figure 1:
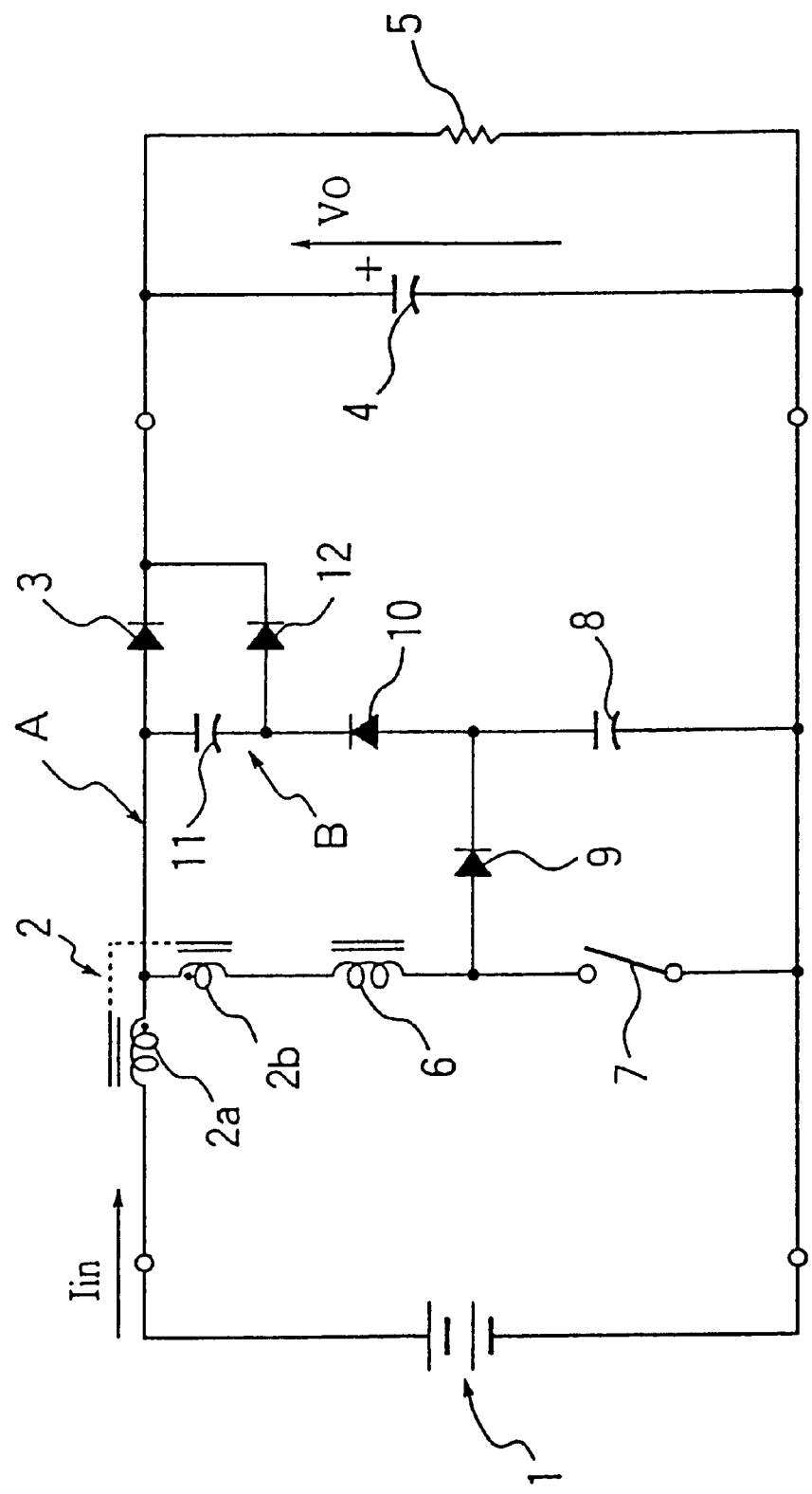
FIG. 1 is a circuit diagram of a step-up type switching power unit in accordance with one embodiment of the present invention.

Embodiments of the present invention will now be described with reference to the drawings. FIG. 1 shows a first embodiment of the present invention including a DC power source 1 having one of terminals connected with a coil 2 which constitutes the first magnetic element. The first coil 2 is divided into a coil portion 2a and a coil portion 2b, and the first coil portion 2a is connected at one end with the power source 1. The other end of the first coil portion 2a is connected through a first diode 3 with one of electrodes of an output smoothing capacitor 4. The capacitor 4 is connected with a load resistor 5 to provide the load resistor 5 with an output. To refer that the coil 2 is divided into the coil portions 2a and 2b means that the coil portions 2a and 2b are provided by windings wound on a common core.

The coil portion 2b of the first coil 2 is connected at one end with the coil portion 2a and at the other end with one end of a switching element 7 through a second coil 6 which constitutes a second magnetic element. The other end of the switching element 7 is connected with the other terminal of the power source 1.

A second capacitor 8 is provided in parallel with the switching element 7. The second capacitor 8 is connected at one of its electrodes through a second diode 9 with the second coil 6 and through a third diode 10 and a third capacitor 11 with a connection A between the coil portion 2a and the first diode 3. The other electrode of the capacitor 8 is connected together with the switching element 7 to the aforementioned other terminal of the power source 1. Further, there is provided a fourth diode 12 to connect a connection B between the third diode 10 and the third capacitor 11 to the output smoothing capacitor 4 bypassing the third capacitor 11 and the first diode 3.

The second diode 9 is connected with the forward direction oriented to pass current from the second coil 6 to the second capacitor 8. The third diode 10 is connected with the forward direction from the second capacitor 8 to the third capacitor 11. The fourth diode 12 has a forward direction toward the output smoothing capacitor 4. The divided coil portions 2a and 2b of the first coil 2 are wound in directions so that they have opposite polarity. The coil portion 2a has an inductance which is large in relation to that of the coil portion 2b. The coil portion 2b is connected so that the voltage produced at the opposite ends of the coil portion 2b applies reverse bias voltage to the diodes 9, 10 and 12. The third capacitor 11 is large in capacity in relation to the second capacitor 8.

Figure 2:
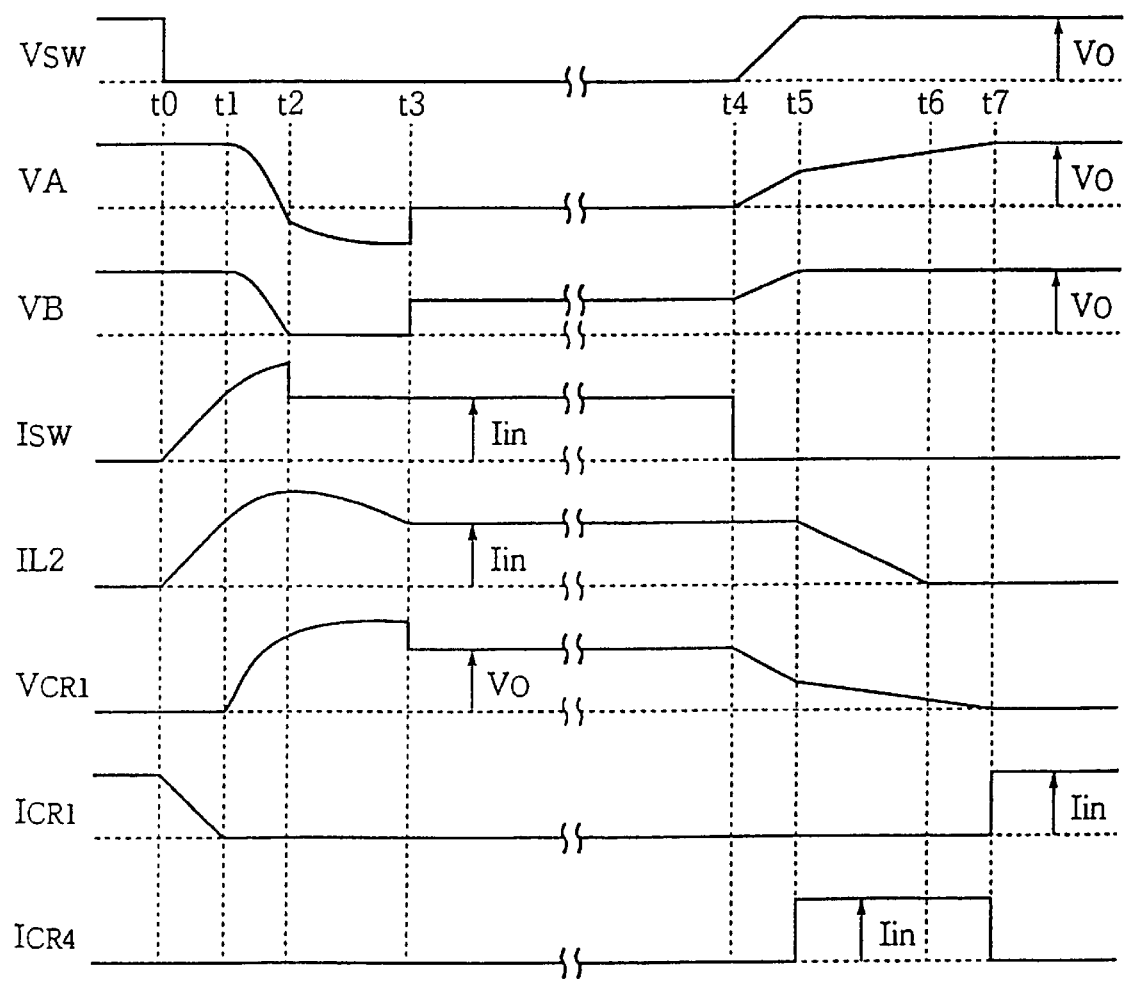
FIG. 2 is a diagram showing voltage and current waveforms in operation of the embodiment shown in FIG. 1.

Operation of the power unit described above will now be described with reference to FIG. 2. When the switching element 7 is moved from the open state to the close state at a time t0, the second coil 6 is subjected to a voltage which is substantially equal to the output voltage, so that current $I_{sw}$ which flows through the second coil 6 to the switching element 7 increases linearly. In this instance, the voltage $V_{sw}$ applied to the switching element 7 decreases rapidly at the same time when the switching element 7 is closed, however, the increase in the current $I_{sw}$ is relatively slow. Thus, there will be substantially no switching loss.

As the current through the switching element 7 increases, the current $I_{CR1}$ which flows through the diode 3 decreases correspondingly, however, since the increase in the current through the switching element is slow, the rate of decrease in the current $I_{CR1}$ through the first diode 3 is also small. As the result, generation of recovery current is suppressed. The recovery current is so small that it does not have any effect on the operation, so that it is not shown in FIG. 2.

The current $I^{L2}$ through the coil 6 increases for a certain time period after the switching element 7 is closed as in the case of the current $I_{SW}$. When a certain period of time has passed after the switching element 7 has been closed, the current $I_{L2}$ through the second coil 6 increases to a value which is equal to the input current $I_{in}$ from the coil portion 2a of the first coil 2 at the time t1. At this instance, the second capacitor starts to discharge and a resonance circuit is produced by the second capacitor 8 through the third diode 10, the third capacitor 11, the coil portion 2b, the second coil 6 and the switching element 7 to initiate resonance. In this state of operation, the second coil 6 and the switching element 7 have a current which is equal to a sum of the input current $I_{in}$ and the resonance current.

At the time when the resonance is initiated, the second capacitor 8 is charged to the output voltage $V_0$ so that the voltage $V_B$ at the connection B between the third diode 10 and the third capacitor 11 is equal to the output voltage $V_0$. At this instance, the voltage across the third capacitor 11 is equal to zero. As the third capacitor 11 is charged as the result of the resonance and the voltage $V_A$ at the connection A gradually decreases, the voltage $V_{CR1}$ applied to the first diode 3 gradually increases correspondingly. Since the increase in the voltage $V_{CR1}$ applied to the first diode 3 is thus slow, it is possible to suppress the voltage applied to the first diode 3 $V_{CR1}$ to a low level. Therefore, even if there is produced a recovery current for a limited time period from the time t1, its value is small and the loss is also small.

The voltage at the connections A and B decreases gradually as the result of the resonance. It is possible that the voltage $V_A$ at the connection A decreases at maximum to a level of $-V_0$. When the voltage $V_A$ at the connection A decreases to the value $-V_0$, the first diode 3 is subjected to a voltage of $2V_0$ so that a substantial voltage durability is required for the diode. It should however be noted that, in accordance with the illustrated embodiment of the present invention, the second capacitor 8 is of a capacitance which is small in relation to the third capacitor, so that it is possible to prevent the voltage $V_A$ at the connection A from decreasing to $-V_0$. More specifically, with the structure described above, the voltage $V_B$ at the connection B decreases to zero before the voltage of the connection A decreases to a value $-V_0$, and the second diode 9 is made conductive at this instance. Therefore, a second resonance circuit is formed from the second diode 9 through the third diode 10, the third capacitor 11, the coil portion 2b and the second coil 6 back to the second diode 9. The state is produced at the timing t2. The third capacitor 11 is further charged as the result of the resonance in the second resonance circuit, so that the voltage $V_A$ at the connection A decreases further but it does not decrease as low as $-V_0$. It is therefore possible to decrease the voltage $V_{CR1}$ applied to the first diode 3.

When the resonance through the second resonance circuit is initiated at the timing t2, the current $I_{L2}$ through the second coil 6 takes a value which is a sum of the input current $I_{in}$ from the coil portion 2a and the resonance current whereas the current $I_{SW}$ which flows through the switching element 7 becomes equal to the input current $I_{in}$. The resonance current in the resonance circuit becomes zero at the timing t3. The resonance current then reverses the polarity at this instance but the resonance current in the reverse direction is blocked by the second diode 9 and the third diode 10. The resonance is thus terminated and operation similar to a conventional step-up type switching power unit is then carried out.

The switching element 7 is then opened at the timing t4. At this instance, the charge in the second capacitor 8 is at zero volt so that the input current $I_{in}$ from the coil portion 2a flows into the capacitor 8 to charge it. The terminal voltage $V_{SW}$ at the switching element 7 is thus increased gradually.

It is therefore possible to make very small the switching loss which may be produced when the switching element 7 is opened.

As the charge of the second capacitor 8 increases, the voltage values $V_A$ and $V_B$ at the connections A and B increase and the voltage $V_B$ becomes equal to the output voltage $V_0$ at the timing t5. In this instance, the second coil 6 is subjected to a voltage which is a sum of the voltage at the third capacitor 11 and the voltage at the coil portion 2b, so that the magnetic energy accumulated in the second coil 6 is reset. The reset current for this function is discharged through the diodes 9, 10 and 12 to the output, whereby the reset current is gradually decreased. Thus, the input current $I_{in}$ from the coil portion 2a is then directed to the first diode 3 in an amount corresponding to the decrease in the reset current. In this instance, the third capacitor 11 is being charged and the voltage $V_A$ at the connection A is lower than the output voltage $V_0$ so that current is supplied to the output side not through the first diode 3 but from the third capacitor 11 through the fourth diode 12. In FIG. 2, the current through the fourth diode 12 by $I_{CR4}$. In this process, the third capacitor 11 discharges gradually.

The magnetic energy in the second coil 6 is spent out at the timing t6 and the reset current is decreased to zero. At this instance, the input current $I_{in}$ from the coil portion 2a is totally directed to the connection A. The discharge of the third capacitor 11 terminates at the timing t7. The voltage $V_A$ at the connection A is then sufficiently high to make the first diode 3 conductive, so that the input current $I_{in}$ from the coil portion 2a is totally passed through the first diode 3. Thereafter, operation similar to a conventional step-up type switching power unit is carried out. Depending on conditions, the reset of the second coil 6 may be completed after the discharge of the third capacitor 11 is finished, however, this may not affect the operation.

The coil portion 2b of the first coil 2 functions to shorten the reset time of the second coil 6 under the influence of the voltage across the coil portion 2b to thereby ensure the reset operation. After the reset, the coil portion 2b produces a voltage which applies a reverse bias to the diodes 9, 10 and 12 to prevent current from flowing through these diodes. It is therefore possible to prevent recovery current to flow when the switching element 7 is closed.

In the circuit described above, the initiation and termination of the resonance are independent from the on-and-off frequency of the switching element 7. The resonance is therefore not affected by the driving frequency. Thus, the driving frequency can be fixed without having any influence on the resonance. It is therefore possible to provide a stable output voltage by providing the device in the form of a PWM (pulse width modulation) type control circuit which is operated under a fixed frequency. Any type of switching means may be adopted for the switching element 7. It is however preferred to adopt a MOSFET.

Figure 3:
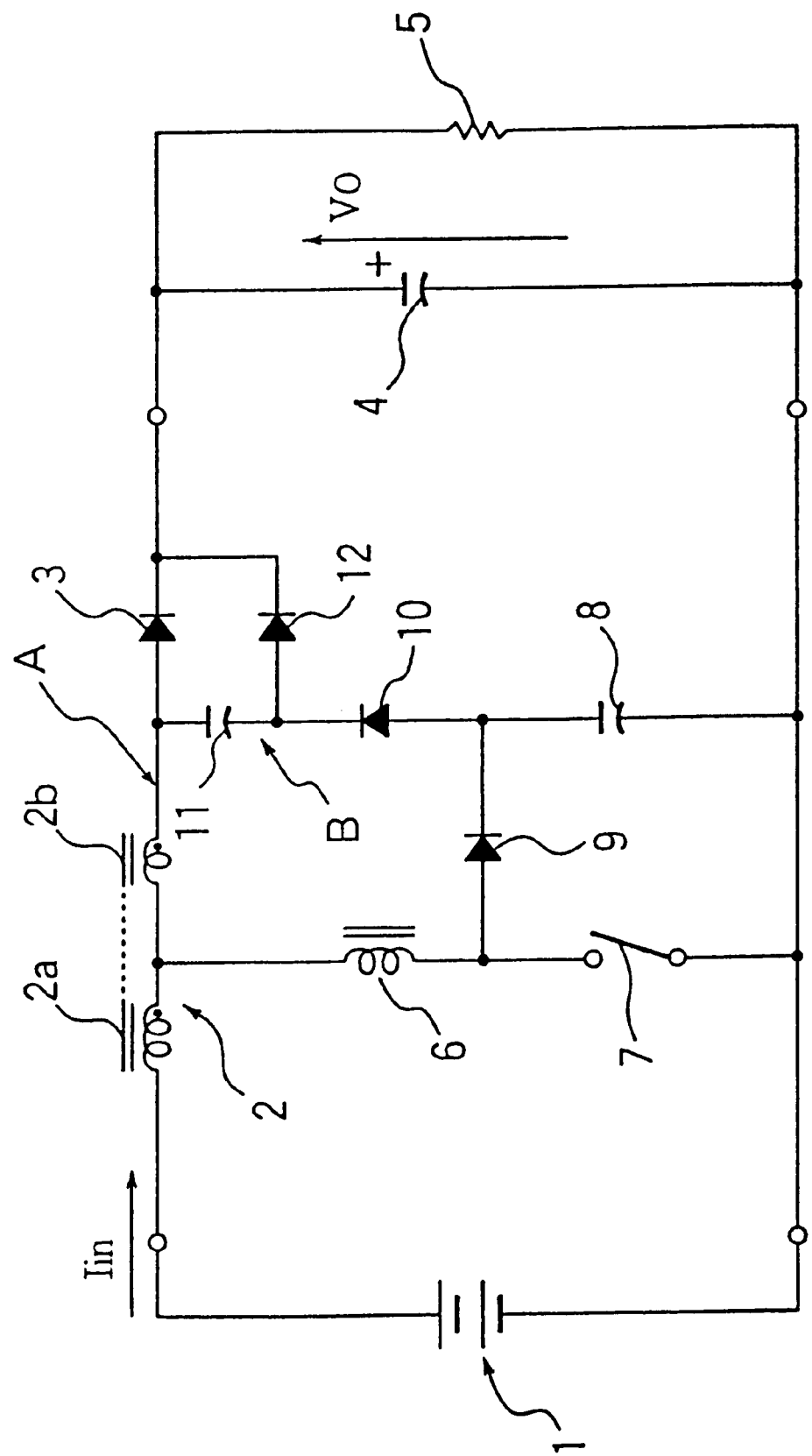
FIG. 3 is a circuit diagram of a step-up type switching power unit in accordance with another embodiment of the present invention.
Figure 4:
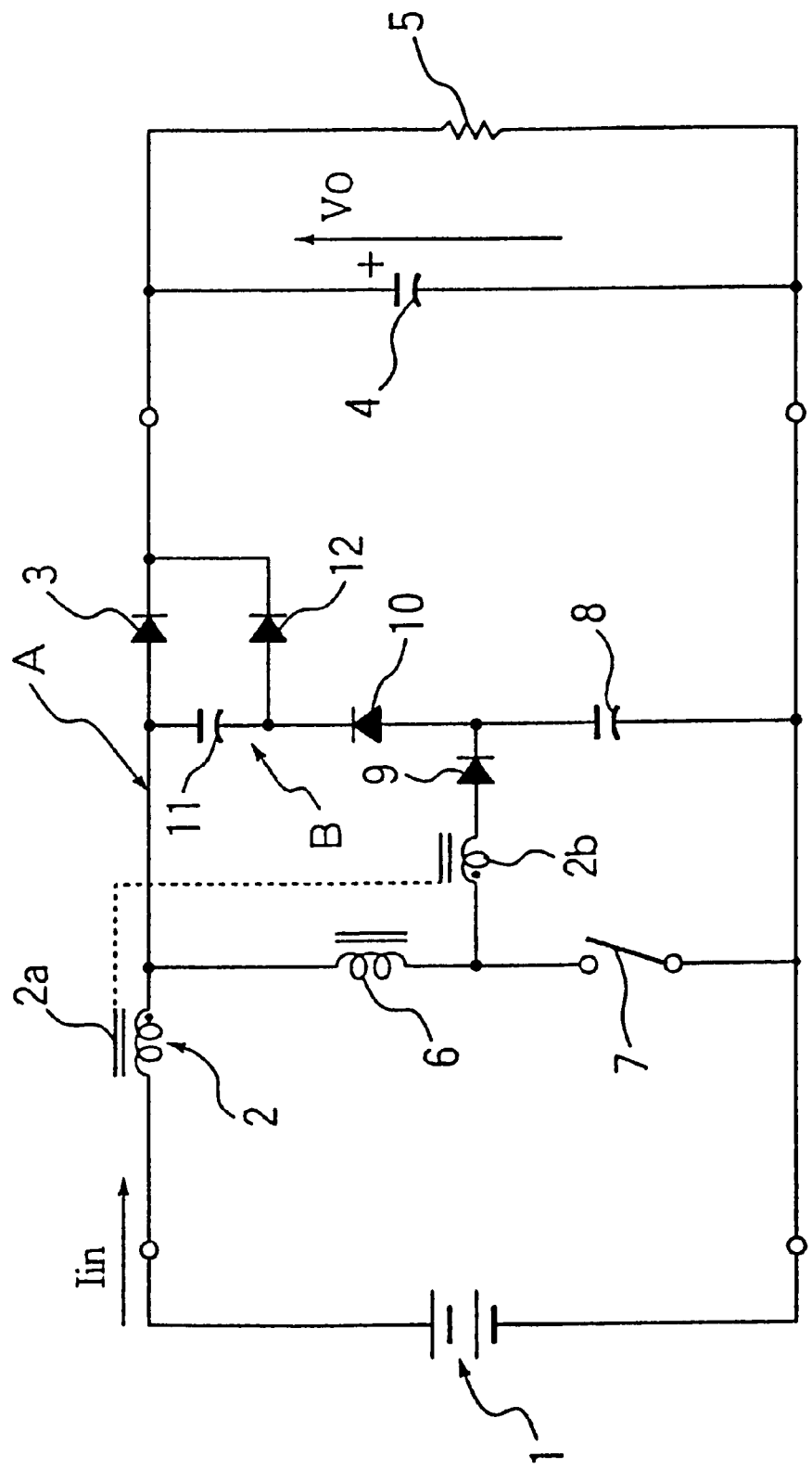
FIG. 4 is a circuit diagram of a step-up type switching power unit in accordance with a further embodiment of the present invention.

FIGS. 3 and 4 show modified examples of the embodiment of the present invention shown in FIG. 1. In these examples, the position of the second coil 6 is not changed but the position of the coil portion 2b is changed. More specifically, in the arrangement of FIG. 3, the coil portion 2b is connected between the coil portion 2a and the first diode 3. In the example of FIG. 4, the coil portion 2b is connected in series with the second diode 9. The function and the results are the same in the both examples as those in the embodiment of FIG. 1.

Figure 5:
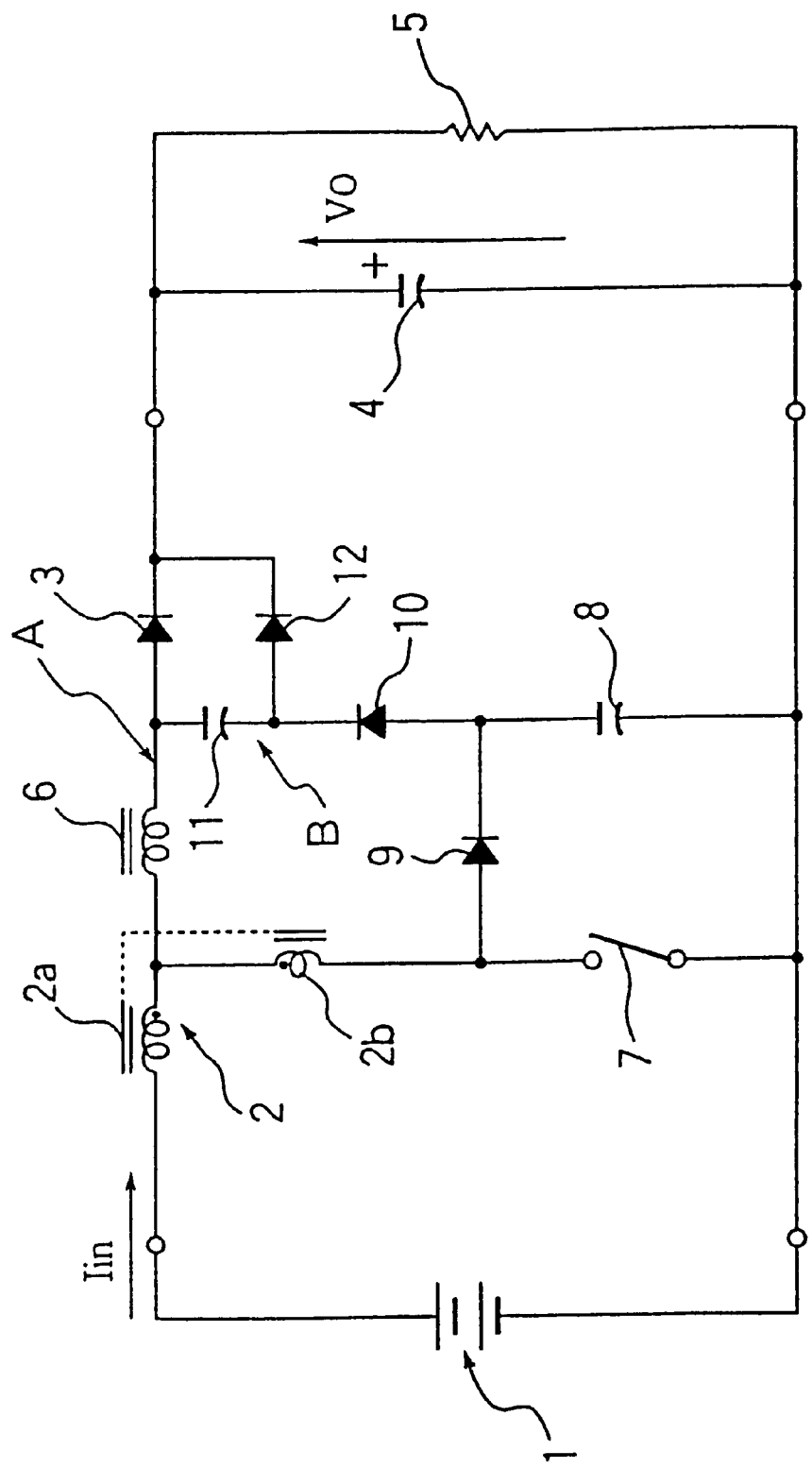
FIG. 5 is a circuit diagram of a step-up type switching power unit in accordance with a still further embodiment of the present invention.
Figure 6:
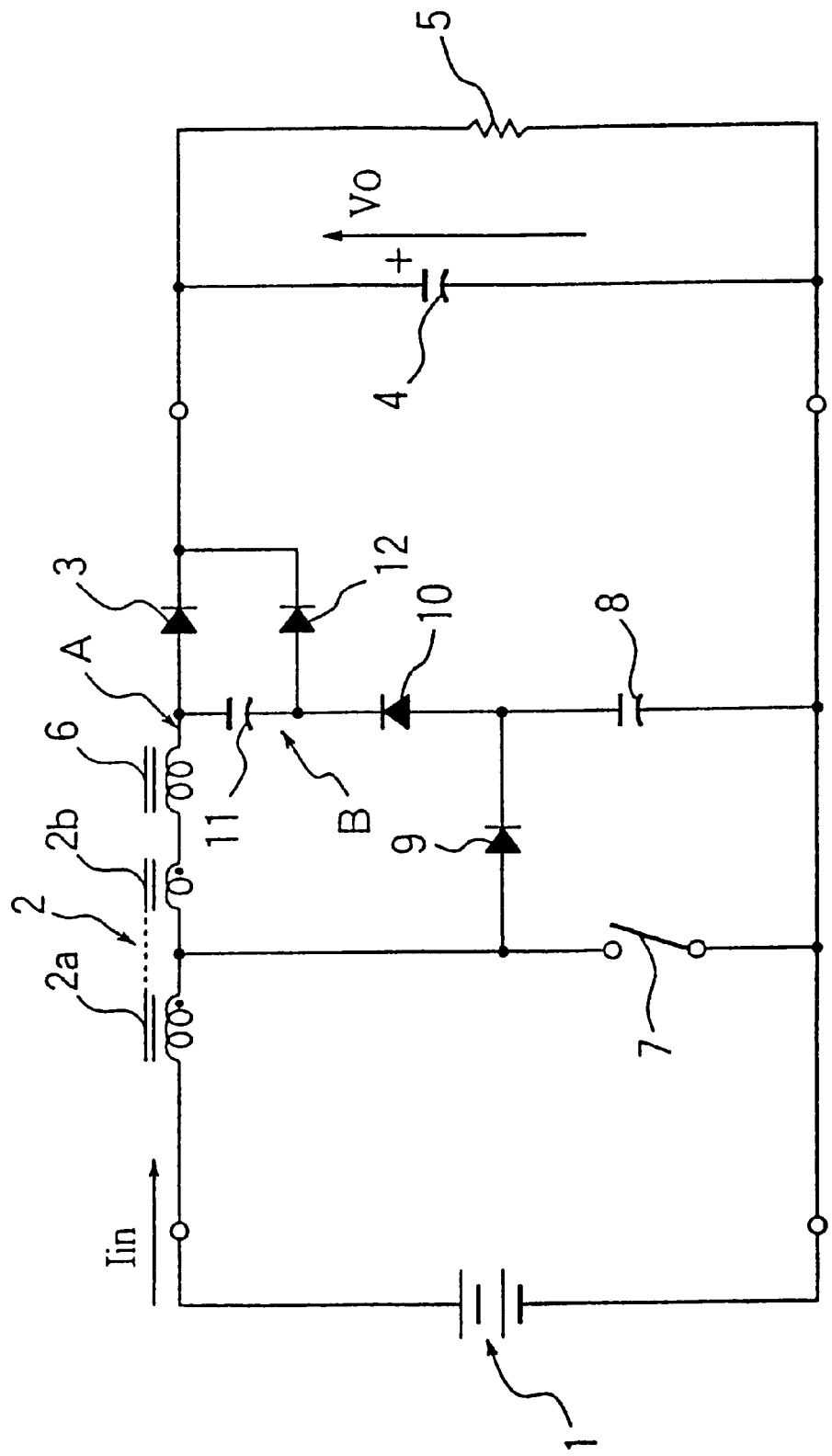
FIG. 6 is a circuit diagram of a step-up type switching power unit in accordance with a still further embodiment of the present invention.
Figure 7:
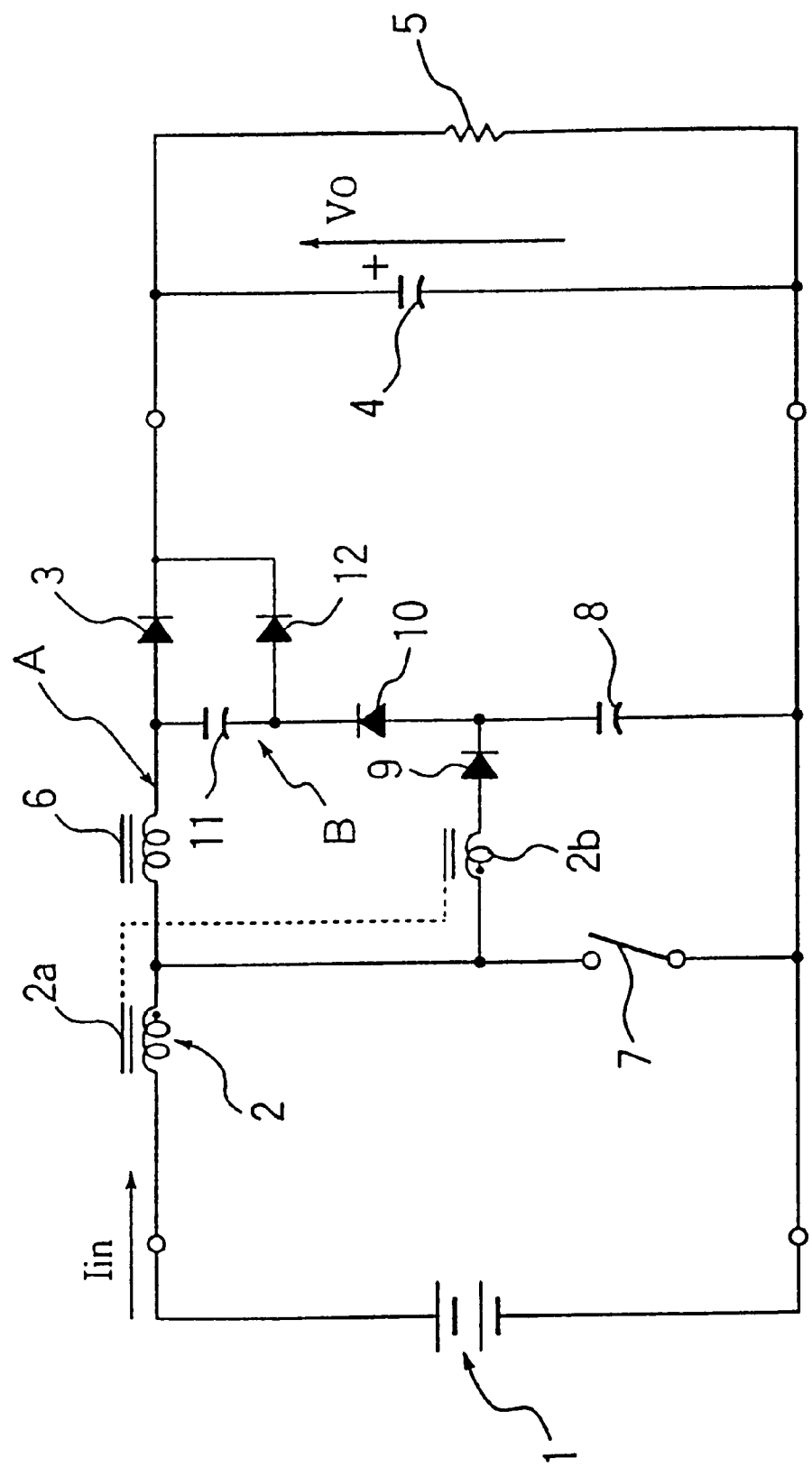
FIG. 7 is a circuit diagram of a step-up type switching power unit in accordance with a still further embodiment of the present invention.

FIG. 5 shows a further embodiment which corresponds to an arrangement in which the positions of the second coil 6 and the coil portion 2b in FIG. 3 are mutually interchanged. FIG. 6 shows a further embodiment of the present invention in which the coil portion 2b and the second coil 6 are connected in series between the coil portion 2a and the first diode 3. FIG. 7 shows a modification of the example shown in FIG. 4. In this modification, the position of the second coil 6 is located between the coil portion 2a and the first diode 3. In either of the examples, there are produced first and second resonance circuits which include the coil portion 2b and the second coil 6.

Figure 8:
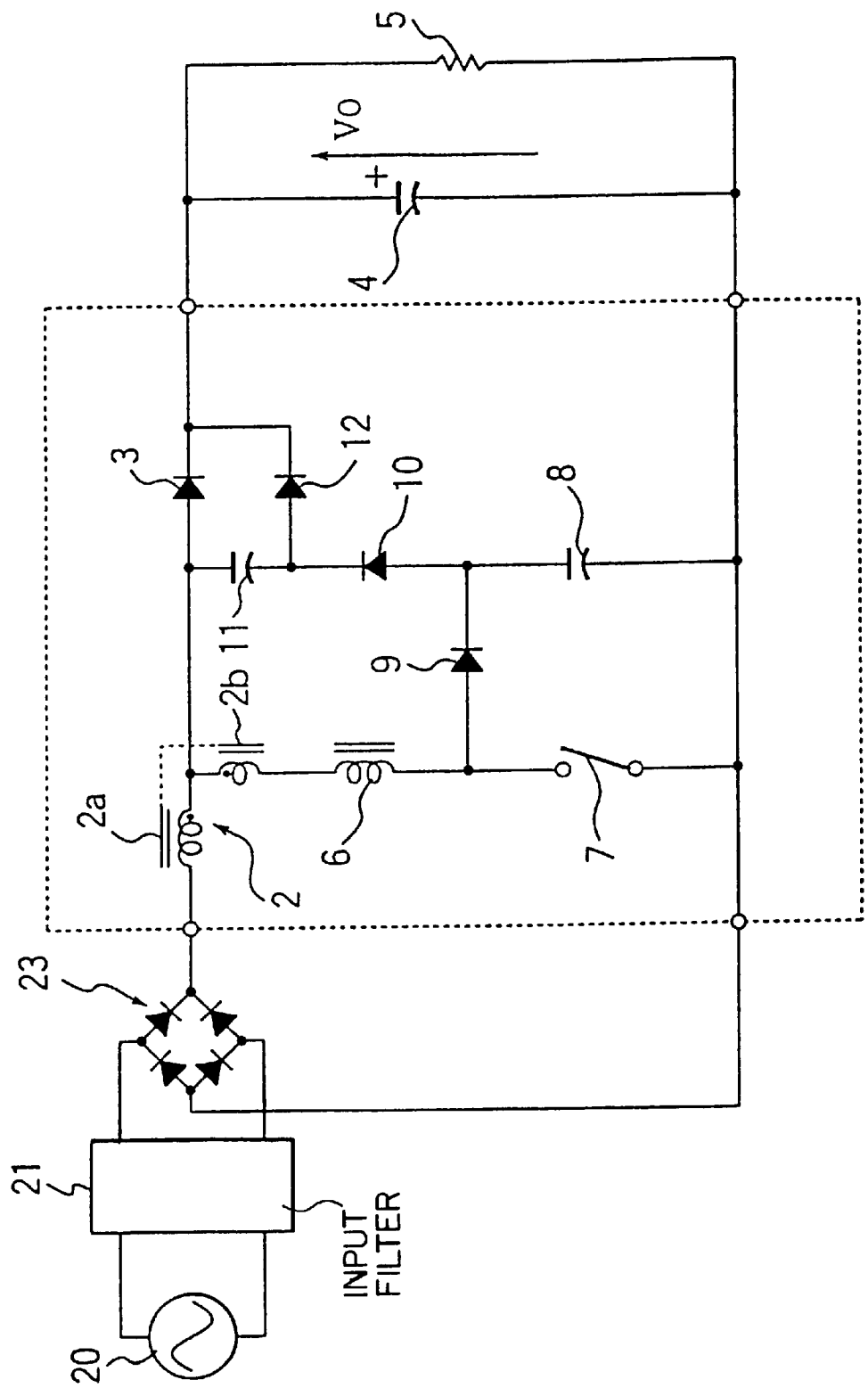
FIG. 8 is a circuit diagram showing an example similar to the embodiment of FIG. 1 but a different type of power source is provided.

FIG. 8 shows an example which utilizes an AC power source 20 in the place of the DC input power source. The structure of the step-up switching section remains the same. The AC power source 20 is connected with an input filter 21. The input filter 21 provides an output to a full wave rectifying circuit 23 to thereby produce a DC output which is applied to the circuit shown in FIG. 1.

Figure 9:
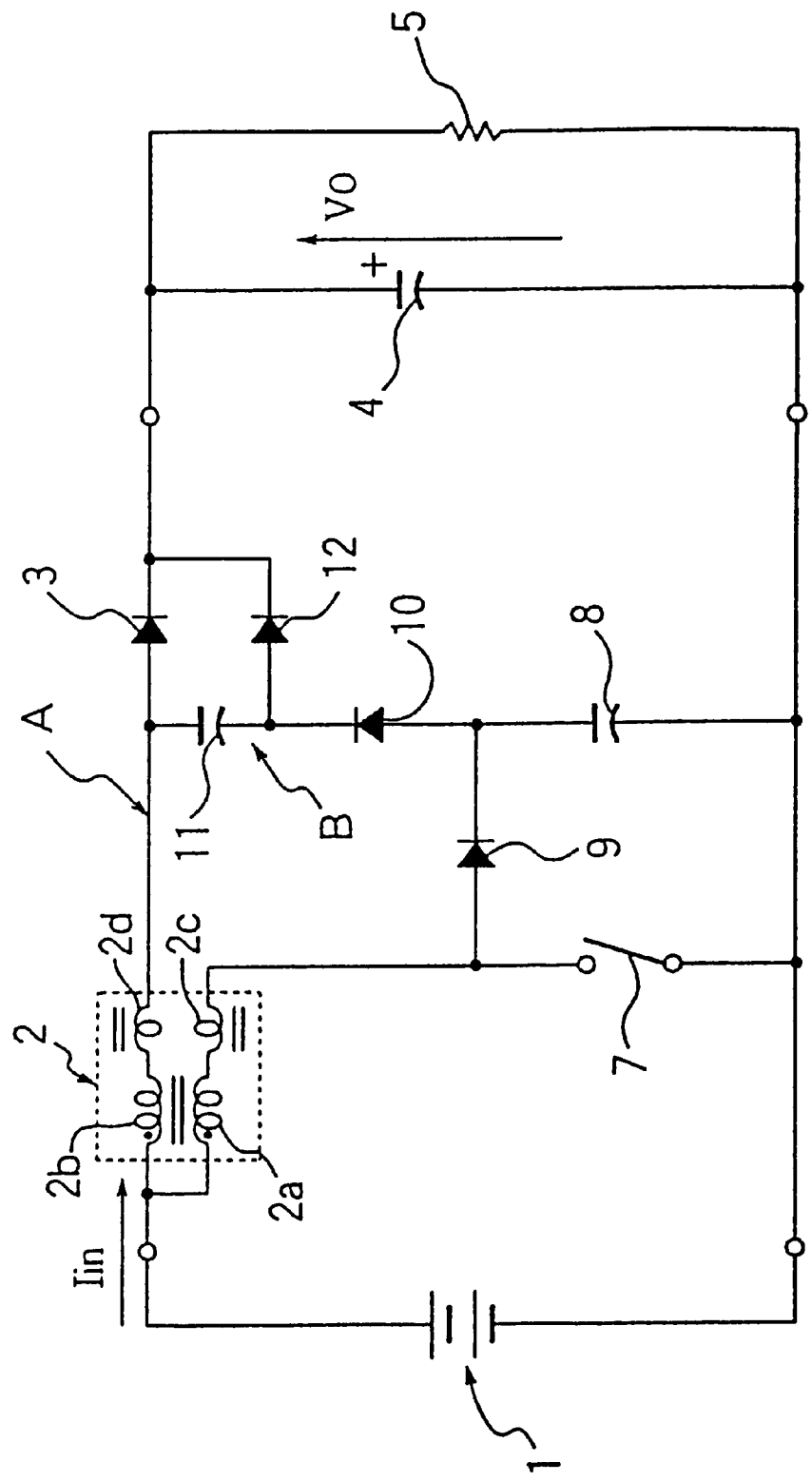
FIG. 9 is a circuit diagram of a step-up type switching power unit in accordance with a still further embodiment of the present invention.

A further embodiment of the present invention is shown in FIG. 9. In this embodiment, corresponding parts are designated by the same reference characters as in the previous embodiments. In this embodiment, one of the terminals of the DC power source or the power source section 1 is connected with a coil 2 which constitutes a magnetic element. The coil 2 includes a first winding 2a and a second winding 2b each of which has one end connected with the power source section 1. The fact that the coil 2 includes the first winding 2a and the second winding 2b means that the first winding 2a and the second winding 2b are constituted by windings wound on the same core.

The other end of the first winding 2a of the coil 2 is connected with one end of a switching element 7. It should be noted that the first winding 2a has an inductance which includes an inductance component called as a leak inductance which is not magnetically coupled with the second winding 2b. The leak inductance can be designated equivalently as a coil or a leak inductor 2c connected in series between the first winding 2a and the switching element 7.

The other end of the second winding 2b of the coil 2 is connected through a first diode 3 with one of the electrodes of the output smoothing capacitor 4. As in the case of the first winding 2a, the inductance component of the second winding 2b also includes an inductance component called a leak inductance which is not magnetically coupled with the first winding 2a. The leak inductance component can be designated equivalently as a coil 2d connected in series between the second winding 2b and the first diode 3. The capacitor 4 is connected with a load resistor 5 to provide an output to the load resistor 5.

A second capacitor 8 is provided in parallel with the switching element 7. The second capacitor 8 is connected at one of the electrodes through a second diode 9 with the first winding 2a of the coil 2 and through a third diode 10 and a third capacitor 11 with a connection A between the second winding 2b an the first diode 3. The other electrode of the second capacitor 8 is connected together with the switching element 7 to the aforementioned other terminal of the power source 1. There is further provided a fourth diode 12 to connect a connection B between the third diode 10 and the third capacitor 11 to the output smoothing capacitor 4 bypassing the third capacitor 11 and the first diode 3.

The second diode 9 has a forward direction to allow current to flow from the first winding 2a of the coil 2 to the second capacitor 8. The third diode 10 has a forward direction oriented from the second capacitor 8 toward the third capacitor 11. The fourth diode 12 has a forward direction oriented toward the output smoothing capacitor 4.

The first and the second windings 2a and 2b are wound so that the ends connected with the power source 1 have the same polarity. The second winding 2b has a number of turns which is larger than that of the first winding 2a. The third capacitor 11 has a capacitance which is larger than that of the second capacitor 8.

Operation of the aforementioned power unit will now be described with reference again to FIG. 2. When the switching element 7 is moved from the open state to the closed state at the timing t0, the coil portions 2c and 2d equivalently shown in the coil 2 in FIG. 9 are subjected to a voltage which is substantially equal to the output voltage. Thus, the current $I_{SW}$ flowing through the first winding 2a of the coil 2 to the switching element 7 is linearly increased. In this instance, the voltage $V_{SW}$ applied to the switching element 7 is decreased rapidly as soon as the switching element 7 is closed, however, the current $I_{SW}$ increases relatively slowly. Therefore, there will be substantially no switching loss.

The current $I_{CR1}$ flowing through the first diode 3 is decreased by an amount corresponding to the increase in the current through the switching element 7. Since the increase in the current through the switching element 7 is slow, the rate of decrease in the current I CR1 flowing through the first diode 3 is also small. As the result, generation of the recovery current is suppressed. Since the recovery current is so small that it does not affect the operation, is not shown in FIG. 2.

The current $I_{L2a}$ (this is designated in FIG. 2 as $I_{L2}$) flowing through the first winding 2a of the coil 2 increases as the current $I_{SW}$ do when the switching element 7 is closed for a certain time period. As a certain time period passes and at the timing t1, the current $I_{L2a}$ flowing through the first winding 2a of the coil 2 reaches a value equal to the input current $I_{in}$. The second capacitor 8 then starts to discharge, and a first resonance circuit is formed from the second capacitor 8 through the third diode 10, the third capacitor 11, the first and second windings 2a and 2b of the coil 2 and the switching element 7 to initiate a resonance. In this state of operation, the current through the first winding 2a of the coil 2 and the switching element 7 is a sum of the input current $I_{in}$ from the first winding 2a and the resonance current. The resonance produced in this instance is an L-C resonance generated among the coil portions 2c and 2d equivalently shown in the coil 2, the second capacitor 8 and the third capacitor 11.

At the time when the resonance is initiated, the second capacitor 8 is charged to the level of the output voltage $V_0$ so that the voltage $V_B$ at the connection B between the third capacitor 8 is charged to the level of diode 10 and the third capacitor 11 is equal to the output voltage $V_0$. Further, the voltage across the third capacitor 11 is zero at this instance. When the third capacitor 11 is charged as the result of the resonance, the voltage $V_A$ at the connection A gradually decreases. The voltage $V_{CR1}$ applied to the first diode 3 is correspondingly and gradually increased. Since the increase in the voltage $V_{CR1}$ applied to the first diode 3 is thus slow, the recovery current which may possibly flow for a limited time period is very small if any, so that there will be little loss.

When the voltage at the connections A and B decreases gradually as the result of the resonance, it is possible that the voltage $V_A$ at the connection A decreases at maximum to a level of $-V_0$. When the voltage $V_A$ at the connection A decreases to the value $-V_0$, the first diode 3 is subjected to a voltage of $2V_0$ so that a substantial voltage durability is required for the diode. It should however be noted that, in accordance with the illustrated embodiment of the present invention, the second capacitor 8 is of a capacitance which is small in relation to the third capacitor, so that it is possible to prevent the voltage $V_A$ at the connection A from decreasing to $-V_0$. More specifically, with the structure described above, the voltage $V_B$ at the connection B decreases to zero before the voltage of the connection A decreases to a value $-V_0$, and the second diode 9 is made conductive at this instance. Therefore, a second resonance circuit is formed from the second diode 9 through the third diode 10, the third capacitor 11, the second winding 2b and the first winding 2a of the coil 2 back to the second diode 9. The resonance produced at this instance is an L-C resonance which takes place among the coil portions 2c and 2d shown equivalently in the coil 2 and the third capacitor 11. The state is produced at the timing t2. The third capacitor 11 is further charged as the result of the resonance in the second resonance circuit, so that the voltage VA at the connection A decreases further but it does not decrease as low as $-V_0$. It is therefore possible to make the voltage $V_{CRI}$ applied to the first diode 3 smaller than $2V_0$.

When the resonance through the second resonance circuit is initiated at the timing t2, the current $I_{L2}$ through the second coil 6 takes a value which is a sum of the input current $I_{in}$ from the power source 1 and the resonance current whereas the current $I_{SW}$ which flows through the switching element 7 becomes equal to the input current $I_{in}$. The resonance current in the resonance circuit becomes zero at the timing t3. The resonance current then reverses the polarity at this instance but the resonance current in the reverse direction is blocked by the second diode 9 and the third diode 10. The resonance is thus terminated and operation similar to a conventional step-up type switching power unit is then carried out.

The switching element 7 is then opened at the timing t4. At this instance, the charge in the second capacitor 8 is at zero volt so that the input current $I_{in}$ from the first winding 2a of the coil 2 flows into the capacitor 8 to charge it. The terminal voltage $V_{SW}$ at the switching element 7 is thus increased gradually. It is therefore possible to make very small the switching loss which may be produced when the switching element 7 is opened.

As the charge of the second capacitor 8 increases, the voltage values $V_A$ and $V_B$ at the connections A and B increase and the voltage $V_B$ becomes equal to the output voltage $V_0$ at the timing t5. In this instance, the coil portions 2c and 2d equivalently shown in the coil 2 are subjected to a voltage which is a sum of the voltage at the third capacitor 11 and a voltage corresponding to a difference between the voltage at the first winding 2a of the coil 2 and the voltage at the second winding 2b, so that the magnetic energy accumulated in the coil portions 2c and 2d is reset. The reset current for this function is discharged through the diodes 9, 10 and 12 to the output, whereby the reset current is gradually decreased. Thus, the input current $I_{in}$ from the power source 1 is then directed to the first diode 3 in an amount corresponding to the decrease in the reset current. In this instance, the third capacitor 11 is being charged and the voltage $V_A$ at the connection A is lower than the output voltage $V_0$ so that current is supplied to the output side not through the first diode 3 but from the third capacitor 11 through the fourth diode 12. In FIG. 2, the current through the fourth diode 12 by $I_{CR4}$. In this process, the third capacitor 11 discharges gradually.

The magnetic energy in the coil portions 2c and 2d is spent out at the timing t6 and the reset current is decreased to zero. At this instance, the input current $I_{in}$ from the power source 1 is totally directed to the connection A. The discharge of the third capacitor 11 terminates at the timing t7. The voltage $V_A$ at the connection A is then sufficiently high to make the first diode 3 conductive, so that the input current $I_{in}$ from the power source 1 is totally passed through the first diode 3. Thereafter, operation similar to a conventional step-up type switching power unit is carried out. Depending on conditions, the reset of the second coil 6 may be completed after the discharge of the third capacitor 11 is finished, however, this may not affect the operation.

With the arrangement wherein the number of turns in the first winding 2a of the coil 2 smaller than that of the second winding 2b, the coil portions 2c and 2d are subjected to the voltage which is of a value proportional to the difference in number of turns. This is effective to make the reset time shorter and to ensure reset operation. The voltage proportional to the difference in number of turns in the first and second windings 2a and 2b of the coil 2 applies reverse bias to the diodes 9, 10 and 12 after completion of the reset operation to block current through these diodes. It is therefore possible to prevent the recovery current which may be produced when the switching element 7 is closed.

In the circuit described above, the initiation and termination of the resonance are independent from the on-and-off frequency of the switching element 7. The resonance is therefore not affected by the driving frequency. Thus, the driving frequency can be fixed without having any influence on the resonance. It is therefore possible to provide a stable output voltage by providing the device in the form of a PWM (pulse width modulation) type control circuit which is operated under a fixed frequency. Any type of switching means may be adopted for the switching element 7. It is however preferred to adopt a MOSFET.

In FIG. 9, it is possible to use an AC power source 20 in the place of the input DC power source in a manner shown in FIG. 8. The arrangement of the step-up switching section is similar to that shown in FIG. 1. The AC power source 20 is connected to the input filter 21 which has an output connected to the full wave rectifying circuit 23 to provide a DC output which is in turn applied to the circuit shown in FIG. 1.

Figure 10:
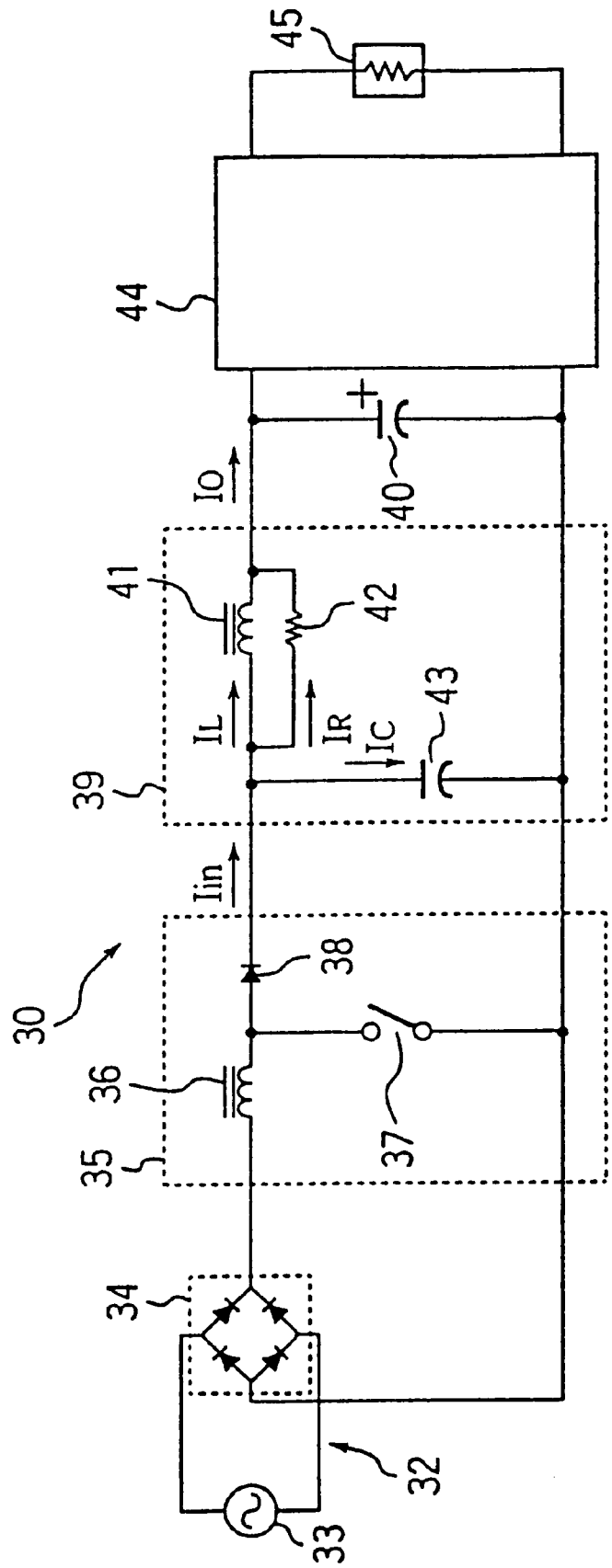
FIG. 10 is a circuit diagram of a switching power unit in accordance with one embodiment of the present invention in which a filter circuit is provided.

Referring to FIG. 10, the switching power unit 30 shown therein includes a power source section 32 comprising an AC power source 33 and a full wave rectifying circuit 34 comprised of a diode bridge. A switching circuit is connected with the power source section 32.

The switching circuit 35 includes an inductor 36 having one end connected with one of the output terminals of the power source section, and a switching element 37 having one end connected with the other end of the inductor 36, the other end of the switching element 37 being connected with the other of the output terminals of the power source section. The inductor 36 constitutes the first magnetic element of the present invention. A diode 38 is connected to the connection between the inductor 36 and the switching element 37 to provide one of the outputs of the switching circuit 35. The other of the outputs of the switching circuit 35 is constituted by the connection between the switching element 37 and the power source section 32.

The outputs of the switching circuit 35 are connected through a filter circuit 39 of the present invention with an output smoothing first capacitor 40. The filter circuit 39 includes an inductor 41 which is connected at one end with a diode 38 in the switching circuit 35 and constitutes a filter circuit magnetic element. A filter circuit resistor 42 is connected in parallel with the inductor 41. There is connected across the outputs of the switching circuit 35 a filter circuit capacitor 43 which constitutes a portion of the filter circuit 39. The filter circuit 39 comprising the filter circuit magnetic element or the inductor 41, the filter circuit resistor 42, and the filter circuit capacitor 43 may be constructed as a unit separate from the switching circuit 35 and the output smoothing first capacitor 40.

The output of the switching circuit 35 is connected through the filter circuit 39 and an output smoothing first capacitor 40 with a DC/DC converter 44. The output of the DC/DC converter 44 is connected with a load 45.

Figure 11:
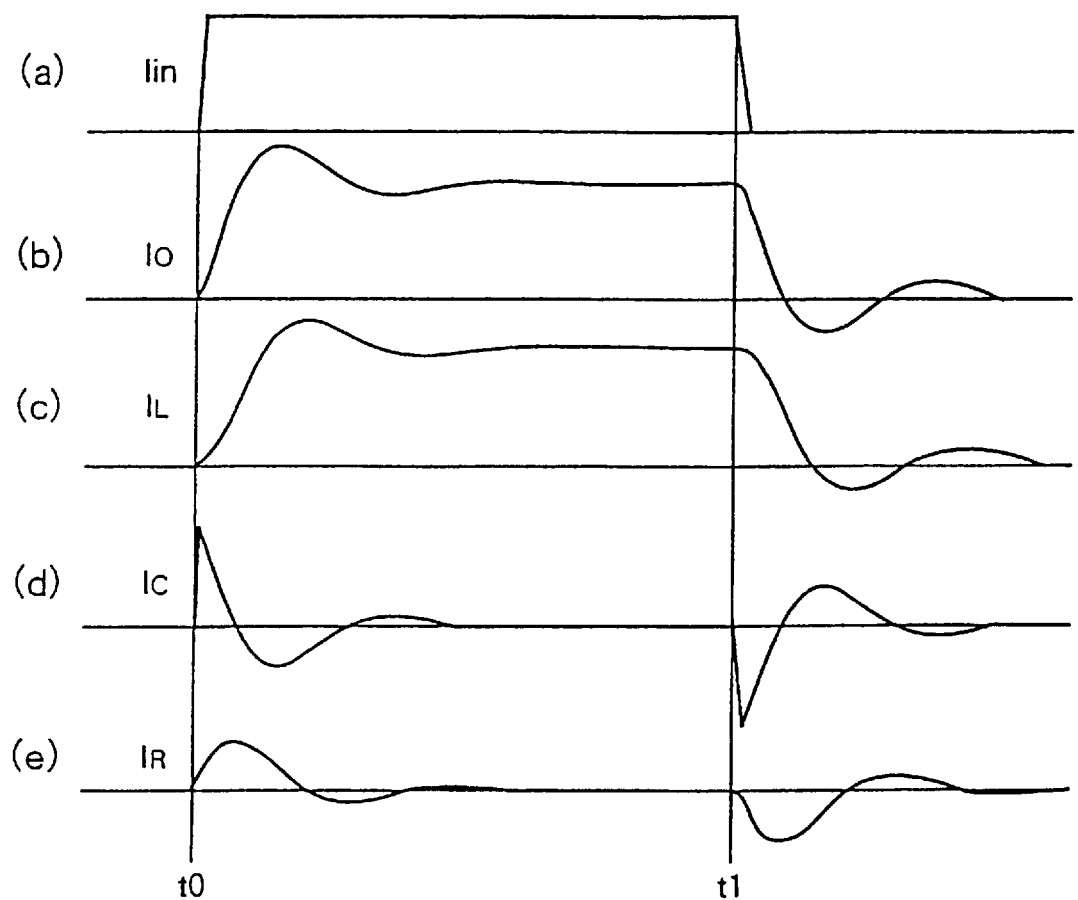
FIG. 11 shows current waveform in the embodiment shown in FIG. 10.

FIG. 11 shows current wave forms in several portions of the switching power unit 30 shown in FIG. 10. In FIG. 11, (a) shows the input current $I_{in}$ to the filter circuit 39, (b) the output current $I_L$ from the filter circuit 39, (d) the inductor current $I_L$ which flows through the inductor 41 constituting the filter circuit magnetic element of the present invention, (d) the capacitor charging current which flows into the filter circuit capacitor 43, and (e) the current $I_R$ through the filter circuit resistor 42.

The output current of the switching circuit 35, that is, the input current $I_{in}$ to the filter circuit 39 rises at the timing $t_0$. Since the input current $I_{in}$ has an extremely short rising time which is generally smaller 50 ns, it can produce noise of high frequency bands particularly of bands higher than 10 MHz. However, in the switching power unit 30 in accordance with the aforementioned embodiment of the present invention, the input current $I_{in}$ having such short rising time is blocked by the inductor 41 from flowing into the first capacitor 40 but flows to the filter circuit capacitor 43 as shown in FIG. 11(d) as a charging current. The resistor 42 functions to apply a braking effort to the resonance to continuously reduce the resonance current.

The input current $I_{in}$ flows once into the filter circuit capacitor 43 to charge it, and then gradually flows through the inductor 41 due to the L-C resonance produced between the inductor 41 and the filter circuit capacitor 43 into the first capacitor 40 as the output current $I_0$. As the result, the current $I_L$ through the inductor 41 rises slowly as shown in FIG. 11(c). Therefore, the current $I_0$ into the output smoothing first capacitor 40 rises slowly.

As shown in FIG. 11(d), the current which flows into the filter circuit capacitor 43 has a short rising time. It should however be noted that the capacitor 43 is not required to have a function of smoothing the output as the first capacitor 40 does. Therefore, the capacitor 43 can be of a capacitance which is small in relation to that of the first capacitor 40. Thus, there is no difficulty in locating the filter circuit capacitor 43 in the vicinity of the switching circuit 35.

The wave form of the current $I_0$ which flows from the filter circuit 39 to the output smoothing first capacitor 40 is determined by the values of the inductor 41, the resistor 42 and the filter circuit capacitor 43 which constitute the filter circuit 39. It is possible to make the rising time of the output current $I_0$ of the filter circuit 39 long by appropriately determining these values. It is preferable, for the purpose of reducing noise in a frequency range higher than 10 MHz, that the rising time of the output current $I_0$, that is, the time from the timing $t_0$ to the timing wherein the maximum value of the output current $I_0$ is reached be larger than 100 ns.

In FIG. 11, the input current $I_{in}$ supplied from the switching circuit 35 to the filter circuit 39 becomes zero at the timing $t_1$. The rising time of the input current $I_{in}$ in this instance is generally less than 50 ns so that it can produce noise. It should however be noted that, in the switching power unit in accordance with this embodiment of the present invention, the inductor 41 tends to maintain the current even after the input current $I_{in}$ has decreased to zero so that current is supplied from the filter circuit capacitor 43. As the result, an L-C resonance is generated between the filter circuit capacitor 43 and the inductor 41. The output current $I_0$ therefore decreases slowly. The resistor 42 functions to reduce the resonance. Therefore, the inductor current $I_L$ falls slowly as shown in FIG. 11(c), and similarly, the output current $I_0$ to the first capacitor 40 falls slowly as shown in FIG. 11(b). In this instance, a current having a short falling time flows through the filter circuit capacitor 43 as shown in FIG. 11(d), however, due to the same reason described previously, generation of noise can be suppressed.

As in the case of the rising time, the falling time of the output current $I_0$ is determined by the values of the inductor 41, the resistor 42 and filter circuit capacitor 43 which constitute the filter circuit 39. It is preferable, for the purpose of reducing noise in the frequency range higher than 10 MHz, that the falling time, that is, the time from the timing $t_1$ to the timing wherein the output current $I_0$ becomes minimum be larger than 100 ns.

Figure 12:
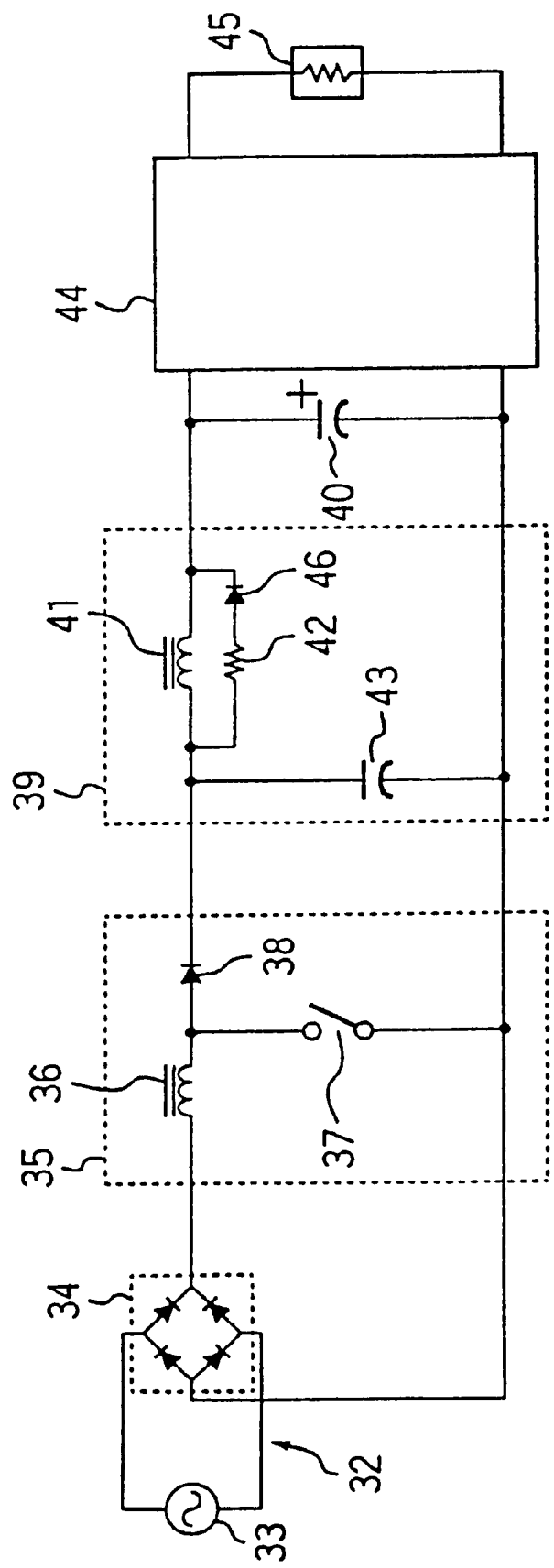
FIG. 12 is a circuit diagram of a step-up type switching power unit in accordance with another embodiment of the present invention in which a filter circuit is provided.

FIG. 12 shows another embodiment of the present invention. In this embodiment, corresponding parts are designated by the same reference numerals as in FIG. 10, and detailed description will be omitted. The embodiment includes a second diode 46 connected in series with the resistor 42 which is in parallel with the inductor 41 in the filter circuit 39. The second diode 46 a forward direction directed toward the connection between the inductor 41 and the first capacitor 40. In this embodiment, when the input current $I_{in}$ is decreased to zero, the second diode 46 is subjected to a reverse bias. Therefore, current to the resistor 42 is blocked. As the result, the current $I_L$ through the inductor 41 becomes equal to the output current $I_0$. It is therefore possible to make the falling time of the output current $I_0$ further longer than that in the embodiment of FIG. 10.

Figure 13:
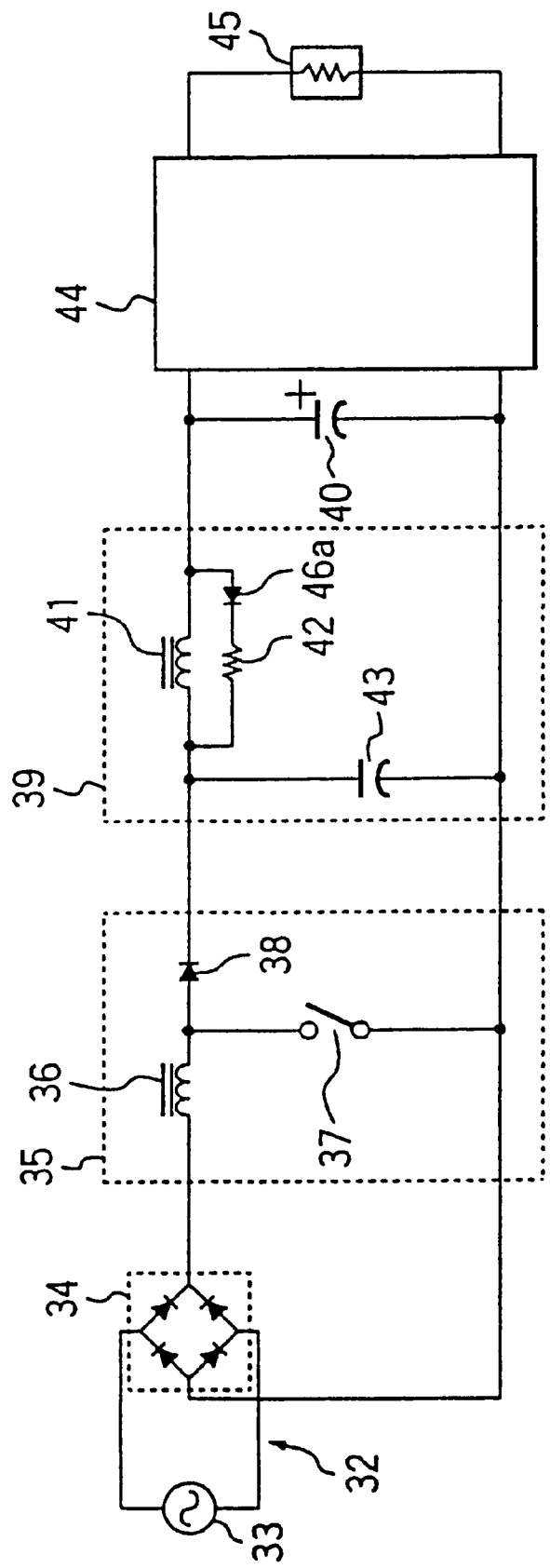
FIG. 13 is a circuit diagram of a step-up type switching power unit in accordance with a further embodiment of the present invention in which a filter circuit is provided; and, FIG. 14 is a diagram showing the result of noise reduction in the switching power unit using the filter circuit in accordance with the present invention.

FIG. 13 shows a further embodiment of the present invention. This embodiment includes a diode 46a connected in series with the resistor 42 in a direction opposite to that in the case of the embodiment in FIG. 12. In this embodiment, it is possible to make the falling time of the output current $I_0$ further longer than that in the embodiment of FIG. 10.

The filter circuit shown in either one of FIGS. 10, 12 and 13 can be combined with the switching power unit of the embodiments describe with reference to FIG. 1, 3 to 9 specifically for providing advantageous results of significant noise reduction. In this instance, the switching circuit shown in either one of FIGS. 1, 3 to 9 may be substituted by the switching circuit 35 shown in either one of FIGS. 10, 12 and 13.

Figure 14:
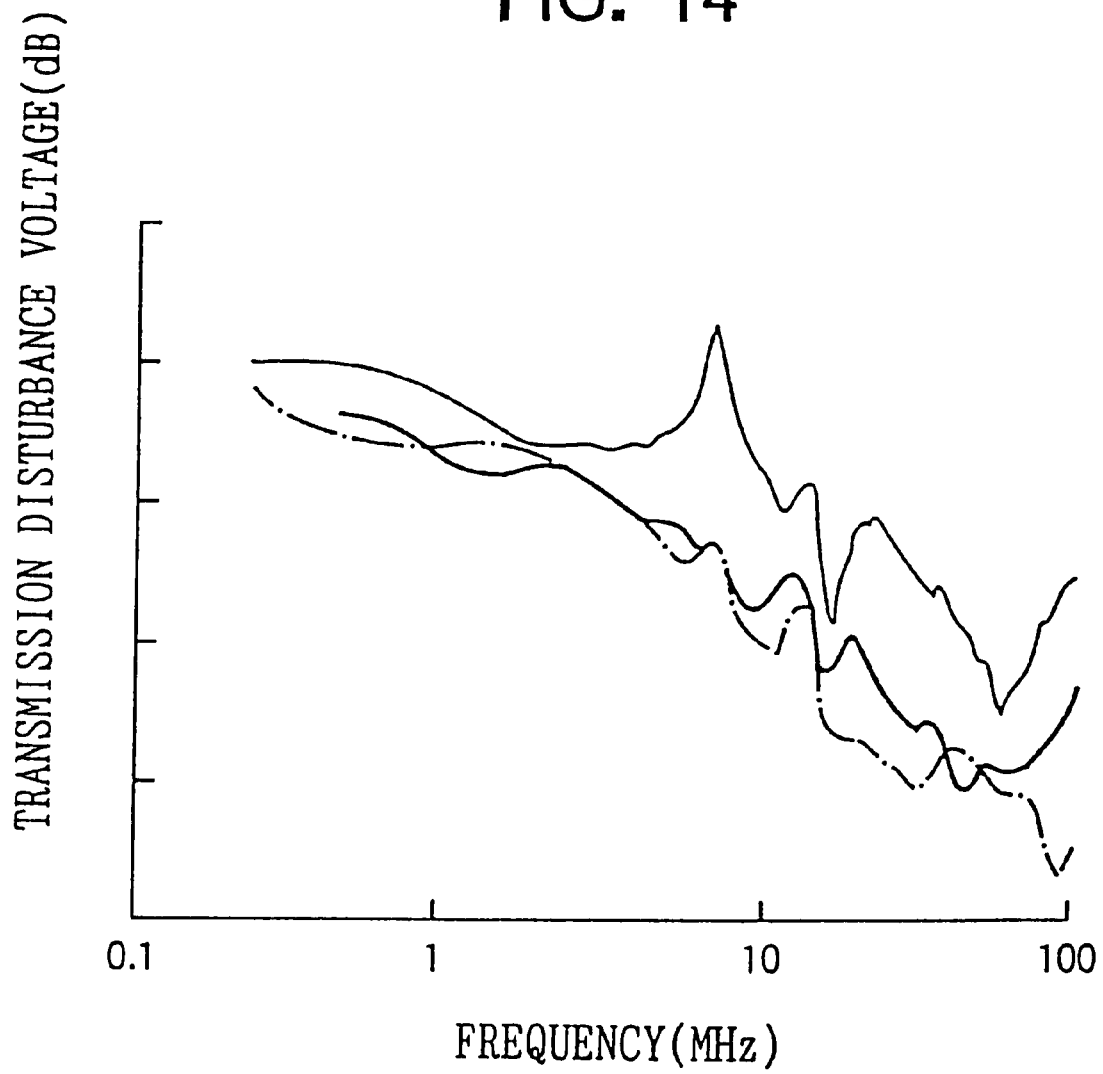

FIG. 14 is a diagram showing the results of noise reduction by the aforementioned filter circuit. In FIG. 14, the thin solid line shows the noise level in a conventional switching power unit which does not include the filter circuit in accordance with the present invention, whereas the thick solid line shows the noise level in the embodiment of FIG. 10. The broken line shows the noise level in the embodiment of the present invention wherein the switching circuit of FIG. 10 is substituted by the switching circuit of FIG. 1. It will be apparent in the drawing that the embodiment of FIG. 10 is effective to reduce noise level throughout the operating frequency as compared with conventional switching power units. Further, in the embodiment of the present invention adopting the switching circuit shown in FIG. 10, it is further possible to reduce noise of frequency regions higher than 10 MHz.

The invention as thus been shown and described in detail with reference to specific embodiments, however, it should be noted that the invention shall in no way be limited to the details of these embodiments but various changes and modifications may be made without departing from the concept of the present invention as defined by appended claims. Therefore, the present invention is intended to include such possible changes and modifications.

We claim:

1. A step-up type switching power unit, comprising;

a first magnetic element connected with one of terminals of a power source section;

a switching device having one end connected with said first magnetic element, and the other end connected with the other of the terminals of said power source section;

a smoothing capacitor connected between said first magnetic element and said other terminal of said power source section;

a first diode connected between the first magnetic element and said smoothing capacitor with a forward direction directed to allow capacitor charging current from said power source section through said first magnetic element to said smoothing capacitor;

wherein output is provided at the opposite ends of said smoothing capacitor;

characterized by;

a second magnetic element provided between said switching device and said first magnetic element;

a second capacitor connected with said first magnetic element in parallel with said switching device, so that said second capacitor is charged in an open state of said switching device by current from said first magnetic element;

wherein rising of current through said switching device is suppressed in an initial period of closing operation of said switching device by passing current from said first magnetic element to said switching device through said second magnetic element;

wherein a first resonance circuit is formed between said first magnetic element and said first diode through said second magnetic element, said switching device and said second capacitor when the current through said second magnetic element has increased to a predetermined value for passing discharge current from the second capacitor.

2. A step-up type switching power unit in accordance with claim 1, which further includes a third capacitor provided between said first magnetic element and said second capacitor in series with said second capacitor so that the third capacitor is charged by resonance current in said first resonance circuit, a bypass circuit provided for connecting said second magnetic element between said second capacitor and said third capacitor, said bypass circuit including a second diode arranged with a forward direction directed from said second magnetic element to said second and third capacitors, whereby said second diode is made conductive when said second capacitor discharges and voltage in said second capacitor is decreased to a predetermined value to form a second resonance circuit between said first magnetic element and said first diode through said second magnetic element, said second diode and said third capacitor to pass discharge current from said third capacitor.

3. A step-up type switching power unit in accordance with claim 2, wherein said first magnetic element is divided into two portions, one of the divided magnetic element portions being connected with said power source section, the other of the magnetic element portions being included in said second resonance circuit.

4. A step-up type switching power unit in accordance with claim 2, wherein a third diode is provided between said second capacitor and said third capacitor with a forward direction directed to pass current from said second diode.

5. A step-up type switching power unit in accordance with claim 4 wherein said third capacitor has a capacitance which is larger than that of said second capacitor.

6. A step-up type switching power unit in accordance with claim 4, wherein a fourth diode is provided to pass current from said third diode to said smoothing capacitor bypassing said third capacitor and said first diode.

7. A step-up type switching power unit in accordance with claim 6 wherein first magnetic element is divided into two portions, one of the divided magnetic portions being connected with said power source section, the other of the magnetic element portions being connected in said second resonance circuit with a polarity that a reverse bias is applied to said second, third and fourth diodes.

8. A step-up type switching power unit, comprising;
a first magnetic element connected with one of terminals of a power source section;
a switching device having one end connected with said first magnetic element, and the other end connected with the other of the terminals of said power source section;
a smoothing capacitor connected between said first magnetic element and said other terminal of said power source section;
a first diode connected between the first magnetic element and said smoothing capacitor with a forward direction directed to allow capacitor charging current from said power source section through said first magnetic element to said smoothing capacitor;
wherein output is provided at the opposite ends of said smoothing capacitor;
characterized by;
a second magnetic element provided in a path of a recovery current which flows from said first diode to said switching device when said switching device is closed;
a second capacitor connected with said first magnetic element in parallel with said switching device, so that said second capacitor is charged in an open state of said switching device by current from said first magnetic element;
wherein a first resonance circuit is formed between said first magnetic element and said first diode through said second magnetic element, said switching device and said second capacitor when said switching device is closed for passing discharge current from the second capacitor.

9. A step-up type switching power unit in accordance with claim 2, which further includes a third capacitor provided between said first magnetic element and said second capacitor in series with said second capacitor so that the third capacitor is charged by resonance current in said first resonance circuit, a bypass circuit provided for connecting said second magnetic element between said second capacitor and said third capacitor, said bypass circuit including a second diode arranged with a forward direction directed from said second magnetic element to said second and third capacitors, whereby said second diode is made conductive when said second capacitor discharges and voltage in said second capacitor is decreased to a predetermined value to form a second resonance circuit between said first magnetic element and said first diode through said second magnetic element, said second diode and said third capacitor to pass discharge current from said third capacitor.

10. A step-up type switching power unit in accordance with claim 9, wherein said first magnetic element is divided into two portions, one of the divided magnetic element portions being connected with said power source section, the other of the magnetic element portions being included in said second resonance circuit.

11. A step-up type switching power unit in accordance with claim 9, wherein a third diode is provided between said second capacitor and said third capacitor with a forward direction directed to pass current from said second diode.

12. A step-up type switching power unit in accordance with claim 11, wherein said third capacitor has a capacitance which is larger than that of said second capacitor.

13. A step-up type switching power unit in accordance with claim 11, wherein a fourth diode is provided to pass current from said third diode to said smoothing capacitor bypassing said third capacitor and said first diode.

14. A step-up type switching power unit in accordance with claim 13, wherein first magnetic element is divided into two portions, one of the divided magnetic portions being connected with said power source section, the other of the magnetic element portions being connected in said second resonance circuit with a polarity that a reverse bias is applied to said second, third and fourth diodes.

15. A step-up type switching power unit, comprising;
a first magnetic element connected with one of terminals of a power source section;
a switching device having one end connected with said first magnetic element, and the other end connected with the other of the terminals of said power source section;
a smoothing capacitor connected between said first magnetic element and said other terminal of said power source section;
a first diode connected between the first magnetic element and said smoothing capacitor with a forward direction directed to allow capacitor charging current from said power source section through said first magnetic element to said smoothing capacitor;
wherein output is provided at the opposite ends of said smoothing capacitor;
characterized by;
said magnetic element includes a first and second windings, said first winding having one end connected with said switching device and the other end connected with said power source section, said second winding having one end connected with said diode and the other end connected with said power source section, whereby current is directed to flow from said power source section to said second winding of said magnetic element when said switching device is opened, and to flow from said power source section to said first winding of said magnetic element when said switching device is closed;
said first and second windings being connected in series in a path of recovery current which flows in an initial period of closing operation of said switching device from said first diode to said switching device, to suppress rising of current through said switching device in the initial period of the closing operation of the switching device;

a second capacitor being connected with said first magnetic element in parallel with said switching element so that the second capacitor is charged in an open state of said switching device by current from the first winding;

wherein a first resonance circuit is formed through said first winding of said magnetic element, said switching device and said second capacitor when the current through said first winding of said magnetic element has increased to a predetermined value for passing discharge current from the second capacitor.

16. A step-up type switching power unit in accordance with claim 15, which further includes a third capacitor provided between said second winding of said magnetic element and said second capacitor in series with said second capacitor so that the third capacitor is charged by resonance current in said first resonance circuit, a bypass circuit provided for connecting said first winding of said magnetic element between said second capacitor and said third capacitor, said bypass circuit including a second diode arranged with a forward direction directed from said first winding to said second and third capacitors, whereby said second diode is made conductive when said second capacitor discharges and voltage in said second capacitor is decreased to a predetermined value to form a second resonance circuit through said magnetic element, said second diode and said third capacitor to pass discharge current from said third capacitor.

17. A step-up type switching power unit in accordance with claim 16 wherein said first winding has number of turns which is smaller than that of the second winding.

18. A step-up type switching power unit in accordance with claim 16, wherein a third diode is provided between said second capacitor and said third capacitor with a forward direction directed to pass current from said second diode.

19. A step-up type switching power unit in accordance with claim 18, wherein a fourth diode is provided to pass current from said third diode to said smoothing capacitor bypassing said third capacitor and said first diode.

20. A step-up type switching power unit in accordance with claim 19 wherein said third capacitor has a capacitance which is larger than that of said second capacitor.

21. A switching power source device comprising;

a switching circuit including a first magnetic element having one end connected with one of output terminals of a power source section, a switching element connected between the other of the output terminals of said power source section and the other end of said first magnetic element, and a diode connected with said first magnetic element and said switching element; and, a first capacitor connected with an output section of said switching circuit for smoothing output of said switching circuit;

characterized by;

a filter circuit connected with said output section of said switching circuit;

said filter circuit including a filter circuit capacitor connected with the output section of said switching circuit, a filter circuit magnetic element having one end connected with one end of said filter circuit capacitor, and a filter circuit resistor connected in parallel with said filter circuit magnetic element, the other end of said filter circuit capacitor and the other end of said filter circuit magnetic element being connected respectively with the opposite ends of said first capacitor.

22. A switching power source device in accordance with claim 21 wherein said switching circuit includes a second magnetic element provided between said switching element and said first magnetic element, and a second capacitor connected with said first magnetic element in parallel with said switching element, whereby said second capacitor is charged by current from said first magnetic element in an open state of said switching element, and current from said magnetic element to said switching element is passed through said second magnetic element to thereby suppress rising of current through said switching element during an initial period of closing operation of said switching element, a resonance circuit being established between said first magnetic element and said diode through said second magnetic element, said switching element and said second capacitor when the current through said second magnetic element is increased to a predetermined value for passing discharge current from said second capacitor.

23. A switching power source device in accordance with claim 21 wherein said switching circuit includes a second magnetic element provided in path of a recovery current which flows from said diode through said switching element, and a second capacitor connected with said first magnetic element in parallel with said switching element, whereby said second capacitor is charged by current from said first magnetic element in an open state of said switching element, a resonance circuit being established between said first magnetic element and said diode through said second magnetic element, said switching element and said second capacitor during closing operation of said switching element for passing discharge current from said second capacitor.

24. A switching power source device in accordance with claim 21, which further includes a second diode connected in series with said filter circuit resistor and in parallel with said filter circuit magnetic element.

25. A switching power source device in accordance with claim 24 wherein said second diode is connected with forward direction directed toward said other end of said filter circuit capacitor.

26. A switching power source device in accordance with claim 24 wherein said second diode is connected with forward direction directed toward said one end of said filter circuit capacitor.

27. A filter circuit for use with a switching power source device comprising a switching circuit including a first magnetic element having one end connected with one of output terminals of a power source section, a switching element connected between the other of the output terminals of said power source section and the other end of said first magnetic element, and a diode connected with said first magnetic element and said switching element, and a first capacitor connected with an output section of said switching circuit for smoothing output of said switching circuit;

said filter circuit comprising;

a filter circuit capacitor connected with the output section of said switching circuit, a filter circuit magnetic element having one end connected with one end of said filter circuit capacitor, and a filter circuit resistor connected in parallel with said filter circuit magnetic element, the other end of said filter circuit capacitor and the other end of said filter circuit magnetic element being connected respectively with the opposite ends of said first capacitor.

28. A filter circuit in accordance with claim 27, which further includes a second diode connected in series with said filter circuit resistor and in parallel with said filter circuit magnetic element.

29. A filter circuit in accordance with claim 28, wherein said second diode is connected with forward direction directed toward said other end of said filter circuit capacitor.

30. A filter circuit in accordance with claim 28, wherein said second diode is connected with forward direction directed toward said one end of said filter circuit capacitor.

* * * * *

UNITED STATES PATENT AND TRADEMARK OFFICE
CERTIFICATE OF CORRECTION

PATENT NO. : 5,909,107
DATED : June 1, 1999
INVENTOR(S) : Aonuma et al.

It is certified that error appears in the above-identified patent and that said Letters Patent is hereby corrected as shown below:

Title page, Item [22] Filing Date, change
"Oct. 10, 1998" to --Oct. 01, 1998--.

Signed and Sealed this

Twenty-fifth Day of January, 2000

Attest:

Attesting Officer

Acting Commissioner of Patents and Trademarks